US012620329B2

(12) United States Patent
Yu et al.

(10) Patent No.: US 12,620,329 B2
(45) Date of Patent: May 5, 2026

(54) DISPLAY DRIVE SYSTEM AND METHOD, AND DISPLAY DEVICE

(71) Applicants: BOE Intelligent IoT Technology Co., LTD., Beijing (CN); BOE Technology Group Co., Ltd., Beijing (CN)

(72) Inventors: Chao Yu, Beijing (CN); Enhui Guan, Beijing (CN); Zhongkui Wan, Beijing (CN); Xinyi Cheng, Beijing (CN); Changlin Leng, Beijing (CN); Xingqun Jiang, Beijing (CN); Youxiang Xia, Beijing (CN)

(73) Assignees: BOE Intelligent IoT Technology Co., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 19/015,597

(22) Filed: Jan. 9, 2025

(65) Prior Publication Data

US 2025/0148946 A1     May 8, 2025

Related U.S. Application Data

(63) Continuation-in-part of application No. 18/026,091, filed as application No. PCT/CN2022/090189 on Apr. 29, 2022, now Pat. No. 12,236,818.

(51) Int. Cl.
*G09G 3/00*     (2006.01)
*G09G 3/32*     (2016.01)
*H10W 90/00*     (2026.01)

(52) U.S. Cl.
CPC ............... *G09G 3/006* (2013.01); *G09G 3/32* (2013.01); *G09G 2330/08* (2013.01); *H10W 90/00* (2026.01)

(58) Field of Classification Search
CPC ...... G09G 3/006; G09G 3/32; G09G 2330/08; H01L 25/167
See application file for complete search history.

(56) References Cited

U.S. PATENT DOCUMENTS

| | | | | |
|---|---|---|---|---|
| 2010/0052572 A1* | 3/2010 | Kataoka | ................. | H05B 45/46 |
| | | | | 315/297 |
| 2010/0176745 A1* | 7/2010 | Keh | .................... | H05B 45/3725 |
| | | | | 315/294 |
| 2011/0007102 A1* | 1/2011 | Ogura | .................. | G09G 3/3291 |
| | | | | 345/690 |
| 2017/0270845 A1* | 9/2017 | Kuo | .......................... | G09G 3/32 |
| 2020/0052033 A1* | 2/2020 | Iguchi | ................. | H10H 29/142 |
| 2020/0302841 A1* | 9/2020 | Jung | ........................ | G09G 3/32 |

(Continued)

*Primary Examiner* — Ryan A Lubit
(74) *Attorney, Agent, or Firm* — IPro, PLLC

(57) ABSTRACT

Provided is a display drive system, including: a plurality of drive units and a control unit. The plurality of drive units are connected to a lamp panel, and at least one of the plurality of drive units is configured to drive, during a display stage, the lamp panel to emit light. The control unit is connected to the plurality of drive units, and is configured to detect an operating state of the drive units driving the lamp panel to emit light. In response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit.

19 Claims, 7 Drawing Sheets

(56)        References Cited

U.S. PATENT DOCUMENTS

| | | | | |
|---|---|---|---|---|
| 2021/0056893 | A1* | 2/2021 | Wei | G09G 3/32 |
| 2021/0343231 | A1* | 11/2021 | Gray | H04B 3/542 |
| 2021/0366369 | A1* | 11/2021 | Wei | G01K 1/026 |
| 2021/0366391 | A1* | 11/2021 | Wei | G01J 1/44 |
| 2022/0020310 | A1* | 1/2022 | Gray | G09G 3/32 |
| 2022/0165208 | A1* | 5/2022 | Sheth | G09G 3/3233 |
| 2022/0215805 | A1* | 7/2022 | Im | G09G 3/3275 |
| 2025/0218366 | A1* | 7/2025 | Chae | G09G 3/32 |

* cited by examiner

<u>300</u>

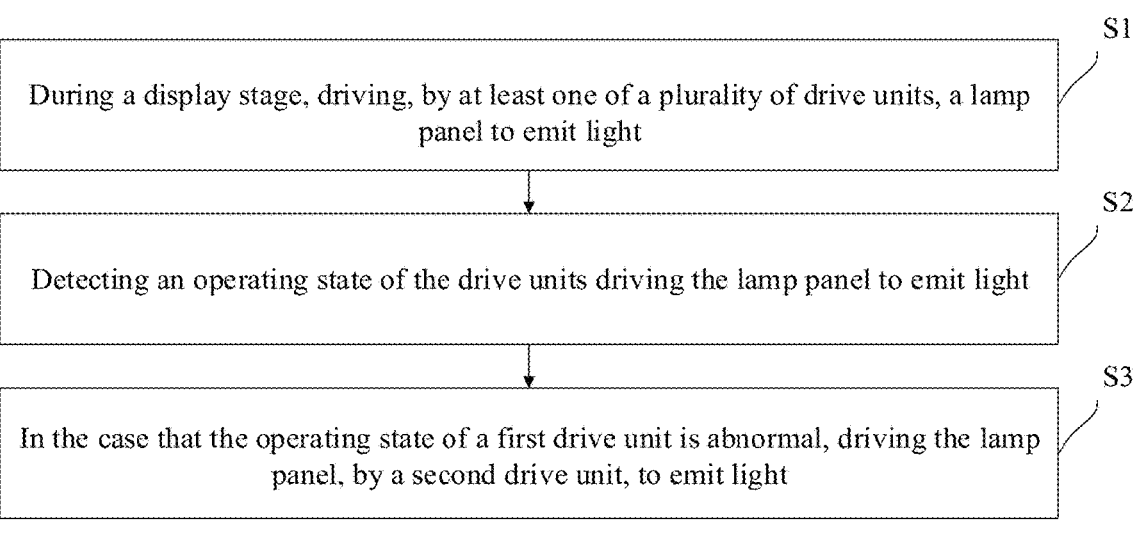

During a display stage, driving, by at least one of a plurality of drive units, a lamp panel to emit light    S1

Detecting an operating state of the drive units driving the lamp panel to emit light    S2

In the case that the operating state of a first drive unit is abnormal, driving the lamp panel, by a second drive unit, to emit light    S3

FIG. 10

Transmitting a fault detection instruction by a transmitter    S81

Receiving the fault detection instruction by a receiver, entering a fault detection mode, transmitting the fault detection instruction to a detection unit, and transmitting detection data to the drive unit    S82

Turning on a first DC-DC conversion module and turning off a second DC-DC conversion module by the control unit    S83

Driving the lamp panel, by the drive unit connected to the first DC-DC conversion module, to display the third color, in the case that a display of the color is abnormal, reporting fault information and sending the display device to be repaired    S84

In the case that the display of the color is normal, turning on the second DC-DC converter module and turning off the first DC-DC converter module by the control unit    S85

Driving the lamp panel, by the drive unit connected to the second DC-DC converter module, to display the third color, in the case that the display of the color is abnormal, reporting fault information and sending the display device to be repaired    S86

FIG. 11

DISPLAY DRIVE SYSTEM AND METHOD, AND DISPLAY DEVICE

This present application is a continuation-in-part application of U.S. patent application Ser. No. 18/026,091, filed on Mar. 13, 2023, which is a US national stage of International application No. PCT/CN2022/090189, filed on Apr. 29, 2022, the disclosure of both of which is herein incorporated by reference in its entirety.

TECHNICAL FIELD

The present disclosure relates to the field of display technologies, and in particular, relates to a display drive system, a display drive method, and a display device.

BACKGROUND

A display device includes a lamp panel and a display drive system. The lamp panel includes a plurality of light-emitting units arranged in arrays. Each of the light-emitting units includes a plurality of sub-units for emitting light of different colors. The plurality of light-emitting units are organized into a plurality of light-emitting unit groups according to their locations, and each of the light-emitting unit groups includes a plurality of light-emitting units. The display drive system includes a plurality of drive integrated circuits (IC), and each of the drive ICs is connected to all of the light-emitting units in one of the light-emitting unit groups and is configured to drive the connected light-emitting units to emit light.

Where the drive IC in the display drive system fails or a signal line connected to the drive IC fails, at least a portion of the light-emitting units of the lamp panel fails to emit light normally, such that a display of the display device is abnormal, and thus reliability of the display drive system is low.

SUMMARY

Embodiments of the present disclosure provide a display drive system, a display drive method, and a display device, which improve the reliability of the display drive system. The technical solutions are as follows.

Some embodiments of the present disclosure provide a display drive system. The display drive system includes a plurality of drive units, a control unit, and a power supply unit; wherein the plurality of drive units are connected to a lamp panel, and at least one of the plurality of drive units is configured to drive, during a display stage, the lamp panel to emit light; and the control unit is connected to the plurality of drive units, and is configured to detect an operating state of the drive units driving the lamp panel to emit light; wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit; and the power supply unit is connected to the plurality of drive units.

In some embodiments, the power supply unit includes a power supply selector and a plurality of power supply sub-units, wherein the power supply selector is connected to the plurality of power supply sub-units and the plurality of drive units; and the power supply selector is configured to receive voltages provided by the plurality of power supply sub-units, and to output a higher voltage among the voltages provided by the plurality of power supply sub-units to the plurality of drive units.

In some embodiments, the power supply selector includes a plurality of diodes; wherein an anode of each of the diodes is connected to an output terminal of one of the plurality of power supply sub-units, the power supply sub-units connected to different diodes are different, and cathodes of the plurality of diodes are connected and respectively connected to the plurality of drive units.

In some embodiments, the drive units driving the lamp panel to emit light include at least two of the plurality of drive units; and the lamp panel comprises a plurality of light-emitting units arranged in arrays, each of the light-emitting units comprising a plurality of light-emitting devices for emitting light of different colors, and the plurality of light-emitting units comprise a plurality of light-emitting unit sets arranged in an array, wherein each of the light-emitting unit sets comprises at least two subsets, each of the subsets comprising at least one light-emitting unit, and light-emitting units in different subsets being connected to different drive units in the at least two drive units.

In some embodiments, the light-emitting units in the at least two subsets are alternately arranged in a first direction and/or a second direction.

In some embodiments, each of the light-emitting unit sets includes two of the subsets, each of the subsets including two light-emitting units.

In some embodiments, the at least two drive units are configured to output, during the display stage, a first drive current to the light-emitting devices of each of the light-emitting units to drive the lamp panel to display a target screen; and the at least two drive units are further configured to stop, in response to a faulty light-emitting unit existing in a first light-emitting unit set, outputting a drive current to light-emitting devices of a light-emitting-unit in a first subset in the first light-emitting unit set, and output a second drive current to light-emitting devices of a light-emitting unit in a second subset to drive the lamp panel to display the target screen, the second drive current being greater than the first drive current; wherein the first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

In some embodiments, the at least two drive units are further configured to output, in response to the faulty light-emitting unit existing in the first light-emitting unit set, a third drive current to light-emitting devices of a light-emitting unit adjacent to the first light-emitting unit set in a second light-emitting unit set, the third drive current being different from the first drive current; wherein the second light-emitting unit set is adjacent to the first light-emitting unit set, and a brightness difference between brightness values of each color corresponding to the first light-emitting unit set and the second light-emitting unit set satisfies a defined condition, the defined condition including the brightness difference being less than a difference threshold, or a ratio of the brightness difference to a brightness value of corresponding color in the second light-emitting unit set being less than a ratio threshold.

In some embodiments, the at least two drive units are further configured to output, in response to the faulty light-emitting unit existing in the first light-emitting unit set, a third drive current that is greater than the first drive current to light-emitting devices of a first target light-emitting unit in the second light-emitting unit set, wherein the first target light-emitting unit is adjacent to the light-emitting unit in the first subset; and/or, the at least two drive units are further configured to output, in response to the faulty light-emitting unit existing in the first light-emitting unit set, a third drive current that is less than the first drive current to light-emitting devices of a second target light-emitting unit in the second light-emitting unit set, wherein the second target light-emitting unit is adjacent to the light-emitting unit in the second subset.

In some embodiments, an absolute value of a difference between the third drive current and the first drive current is positively correlated with the first drive current and negatively correlated with the ratio.

In some embodiments, at least two drive units are further configured to output, in response to the faulty light-emitting unit existing in the first light-emitting unit set, a fourth drive current to light-emitting devices of a third target light-emitting unit in the second light-emitting unit set, wherein an absolute value of a difference between the fourth drive current and the first drive current is equal to an absolute value of a difference between the third drive current and the first drive current, and a symbol of the difference between the fourth drive current and the first drive current and a symbol of the difference between the third drive current and the first drive current are opposite; wherein the third target light-emitting unit is not adjacent to the first light-emitting unit set, and the third target light-emitting unit and the light-emitting unit adjacent to the first light-emitting unit set belong to different subsets.

In some embodiments, each of the drive units includes a plurality of drive integrated circuits (IC), wherein each of the drive ICs is connected to the plurality of light-emitting units through a plurality of drive lines, and the control unit is connected to the plurality of drive lines; wherein the control unit is configured to detect state information of a signal in each of the drive lines, and determine, based on the state information, whether a fault exists in a light-emitting unit connected to the drive line.

In some embodiments, the plurality of drive ICs in each of the drive units are organized into a plurality of drive IC groups, each of the drive IC groups including a plurality of drive ICs arranged along a first direction, and the drive IC groups of the plurality of drive units being alternatively arranged in a second direction.

Some embodiments of the present disclosure further provide a display drive method. The display drive method includes: during a display stage, driving, by at least two of a plurality of drive units, a lamp panel to emit light, wherein the plurality of drive units are connected to the lamp panel; detecting an operating state of the drive units driving the lamp panel to emit light; and in response to the operating state of a first drive unit being abnormal, driving, by a second drive unit, the lamp panel to emit light, wherein the first drive unit is at least one of the drive units driving the lamp panel to emit light, and the second drive unit is at least one of the plurality of drive units other than the first drive unit.

In some embodiments, the lamp panel includes a plurality of light-emitting units arranged in arrays, each of the light-emitting units including a plurality of light-emitting devices for emitting light of different colors; wherein the plurality of light-emitting units include a plurality of light-emitting unit sets arranged in an array, each of the light-emitting unit sets includes at least two subsets, each of the subsets includes at least one light-emitting unit, and light-emitting units in different subsets are connected to different drive units in the at least two drive units; during the display stage, driving, by the at least two of the plurality of drive units, the lamp panel to emit light includes: outputting, during the display stage, a first drive current to the light-emitting devices of each of the light-emitting units to drive the lamp panel to display a target screen; and stopping, in response to a faulty light-emitting unit existing in a first light-emitting unit set, outputting a drive current to light-emitting devices of a light-emitting-unit in a first subset in the first light-emitting unit set, and output a second drive current to light-emitting devices of a light-emitting unit in a second subset to drive the lamp panel to display the target screen, the second drive current being greater than the first drive current; wherein the first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

In some embodiments, during the display stage, driving, by the at least two of the plurality of drive units, the lamp panel to emit light further includes: outputting, in response to the faulty light-emitting unit existing in the first light-emitting unit set, a third drive current to light-emitting devices of a light-emitting unit adjacent to the first light-emitting unit set in a second light-emitting unit set, the third drive current being different from the first drive current; wherein the second light-emitting unit set is adjacent to the first light-emitting unit set, and a brightness difference between brightness values of each color corresponding to the first light-emitting unit set and the second light-emitting unit set satisfies a defined condition, the defined condition including the brightness difference being less than a difference threshold, or a ratio of the brightness difference to a brightness value of corresponding color in the second light-emitting unit set being less than a ratio threshold.

In some embodiments, outputting the third drive current to the light-emitting devices of the light-emitting unit adjacent to the first light-emitting unit set in the second light-emitting unit set includes: outputting a third drive current that is greater than the first drive current to light-emitting devices of a first target light-emitting unit in the second light-emitting unit set, wherein the first target light-emitting unit is adjacent to the light-emitting unit in the first subset; and/or, outputting a third drive current that is less than the first drive current to light-emitting devices of a second target light-emitting unit in the second light-emitting unit set, wherein the second target light-emitting unit is adjacent to the light-emitting unit in the second subset.

Some embodiments of the present disclosure further provide a display device. The display device includes a lamp panel and the display drive system as described above, wherein the display drive system is connected to the lamp panel.

Some embodiments of the present disclosure further provide a display drive device. The display device includes a memory and a processor; wherein the memory stores one or more computer programs, wherein the one or more computer programs, when loaded and run by the process, cause the processor to perform the display drive method as described above.

Some embodiments of the present disclosure further provide a computer-readable storage medium. The computer-readable storage medium stores one or more instructions, wherein the one or more instructions, when loaded and executed by a processor, cause the processor to perform the display drive method as described above.

Some embodiments of the present disclosure further provide a computer program product. The computer program product stores one or more instructions therein, wherein the one or more instructions, when loaded and executed by a computer, cause the computer to perform the display drive method as described above.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

FIG. 10 is a flowchart of a display drive method according to some embodiments of the present disclosure;

FIG. 11 is a process schematic diagram of a fault detection process according to some embodiments of the present disclosure;

DETAILED DESCRIPTION

The present disclosure is described in further detail with reference to the accompanying drawings, to clearly present the objects, technical solutions, and advantages of the present disclosure.

For a clearer understanding of the embodiments of the present disclosure, the structure of a display device is described hereinafter first.

Figure 1:
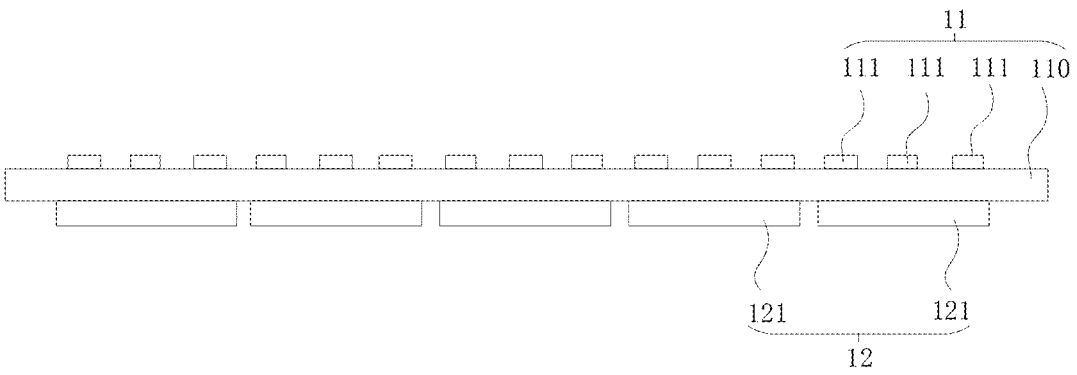
FIG. 1 is a schematic diagram of a display device in the related art.

FIG. 1 is a schematic diagram of a display device in the related art. As illustrated in FIG. 1, The display device includes a lamp panel 11 and a display drive system 12. The lamp panel 11 includes a first substrate 110 and a plurality of light-emitting units 111 disposed on a first surface of the first substrate 110.

The display drive system 12 includes a plurality of drive ICs 121. The plurality of drive ICs 121 are disposed on a second surface of the first substrate 110. The first surface and the second surface herein are two opposite surfaces of the first substrate 110. In some embodiments, the plurality of drive ICs 121 are directly connected to the second surface of the first substrate. In other embodiments, the plurality of drive ICs 121 are arranged on a second substrate (the second substrate integrated with the drive ICs is referred to as a drive board) in arrays and are connected to the lamp panel 11 by the second substrate.

Figure 2:
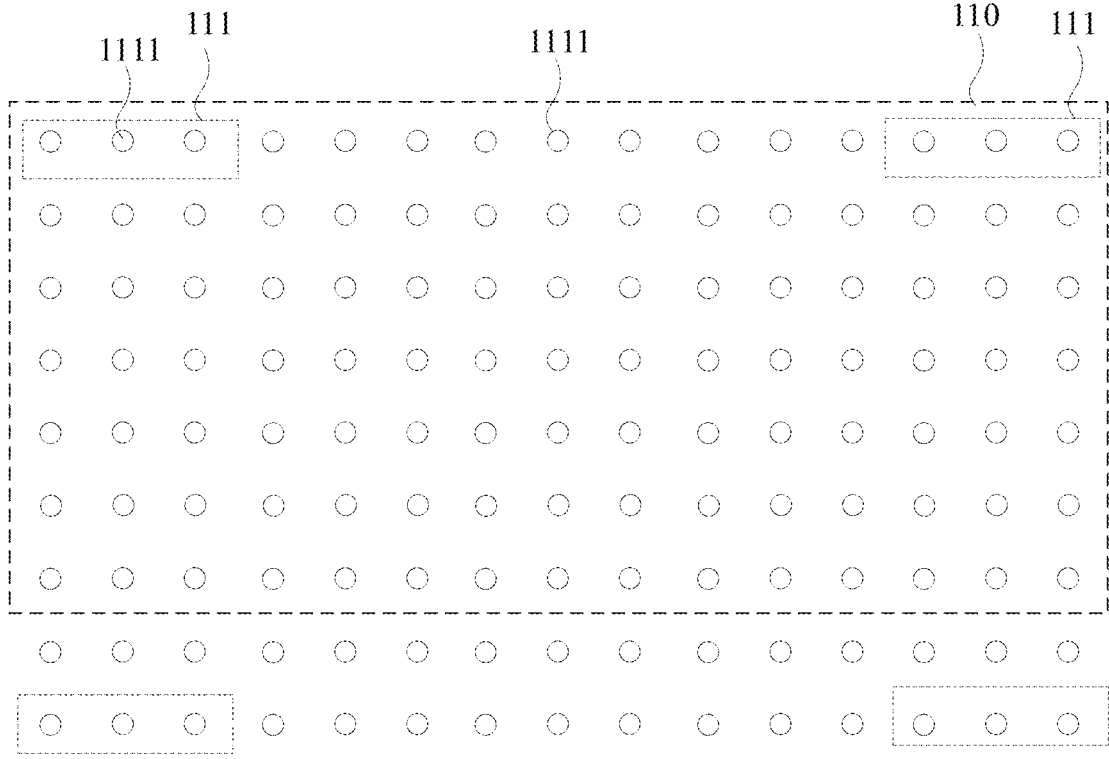
FIG. 2 is a structural top view of a partial region of the display device as illustrated in FIG. 1.

FIG. 2 is a structural top view of a partial region of the display device as illustrated in FIG. 1. As illustrated in FIG. 2, the plurality of light-emitting units 111 are arranged in arrays and form a light-emitting unit array. Each of the light-emitting units 111 includes light-emitting devices 1111 for emitting light of different colors. For example, each of the light-emitting units 111 includes a first light-emitting device, a second light-emitting device, and a third light-emitting device, wherein the first light-emitting device is configured to emit blue light, the second light-emitting device is configured to emit red light, and the third light-emitting device is configured to emit green light.

In some embodiments of the present disclosure, the light-emitting device 1111 is a current drive device. Exemplarily, the light-emitting device 1111 is a light-emitting diode (LED) chip, such as a mini LED chip or a micro LED chip. The first substrate 110 is a printed circuit board (PCB) or other types of substrate capable of routing signal lines, such as a glass substrate. The display device is an LED display device.

The light-emitting unit array is divided into a plurality of light-emitting unit sub-arrays. A dashed box in FIG. 2 is one of the light-emitting unit sub-arrays, and the light-emitting unit sub-array includes eight rows and five columns of light-emitting units 111. The light-emitting unit sub-array herein is a virtual division of the light-emitting unit array. Each of the drive ICs is connected to all of the light-emitting units in one of the light-emitting unit sub-arrays and is configured to drive the light-emitting units in the connected light-emitting unit sub-array to emit light.

In addition to the drive IC, the display drive system further includes a signal line connected to the drive IC. The signal line is configured to supply a corresponding signal to the drive IC to control the lamp panel to emit light.

In the case that the display drive system fails, for example, the signal line and/or the drive IC fails, at least a portion of the light-emitting units do not emit light normally, resulting in an abnormal display of the display device. Therefore, some embodiments of the present disclosure provide a display drive system. The display drive system includes a plurality of drive units. Each of the plurality of drive units is capable of independently driving the lamp panel to emit light, and at least two of the plurality of drive units are capable of jointly driving the lamp panel to emit light. In this way, during a display stage, in the case that a portion (e.g., one) of the drive units driving the lamp panel to emit light has an abnormal operating state (the drive unit with the abnormal operating state is referred to as a first drive unit), the lamp panel is driven, by at least one (a second drive unit) of the plurality of drive units other than the first drive unit, to emit light, such the reliability of the display device is improved.

In some embodiments of the present disclosure, the plurality of drive units refer to at least two drive units. For the convenience of illustration, descriptions of the embodiments of the present disclosure are given hereinafter using a scenario where the display drive system includes two drive units as an example.

Figure 3:
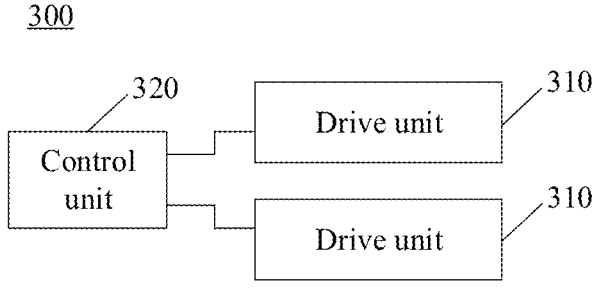
FIG. 3 is a structural schematic diagram of a display drive system according to some embodiments of the present disclosure.

The structure and functions of the display drive system are described in detail hereinafter in conjunction with the accompanying drawings. As illustrated in FIG. 3, the display drive system 300 includes two drive units 310 and a control unit 320. Both the two drive units 310 are connected to a lamp panel, and at least one of the two drive units 310 is configured to drive, during a display stage, the lamp panel to emit light. In some embodiments of the present disclosure, the two drive units 310 simultaneously drive the lamp panel to emit light, or each of the two drive units 310 independently drives the lamp panel to emit light. The control unit 320 is connected to the two drive units 310 for detecting an operating state of the drive units 310 driving the lamp panel to emit light. The control unit is further configured to drive, by a second drive unit, in response to detecting that a first drive unit is abnormal, the lamp panel to emit light. The first drive unit is one of the drive units 310 driving the lamp panel to emit light, and the second drive unit is the other of the two drive units 310 other than the first drive unit.

The display drive system according to some embodiments of the present disclosure includes two drive units that are capable of independently driving the lamp panel to emit light. Therefore, in the case that the control unit detects that one of the drive units driving the lamp panel to emit light is abnormal, the lamp panel is driven, by any other of the drive units that is normal, to emit light, such that the reliability of the display drive system is improved.

In a first possible implementation, the two drive units 310 are capable of simultaneously driving the lamp panel to emit light, such that the lamp panel displays a target image. And each of the drive units 310 is connected to each of the light-emitting units in the lamp panel. In the case that the two drive units 310 simultaneously drive the lamp panel to emit light, the two drive units are configured to output first drive currents to the light-emitting devices in each of the light-emitting units corresponding to the target image to drive each of the light-emitting devices of the lamp panel to emit light.

In this case, the current required for the light-emitting devices of each of the light-emitting units is allocated to the two drive units 310 according to a defined ratio, and the two drive units 310 respectively output the first drive currents to each of the light-emitting devices based on their corresponding ratio.

In some examples, the defined ratio is 1:1. That is, the two drive units 310 output the first drive currents of the same magnitude to a target light-emitting device. In this way, the first drive current output by each of the two drive units 310 to the target light-emitting device is half of the current required for the target light-emitting device.

In other examples, the defined ratio may be any ratio other than 1:1. That is, the two drive units 310 output the first drive currents of different magnitudes to the target light-emitting device. For example, the defined ratio is 3:7 or 2:3. In the case that the defined ratio is 3:7, one of the two drive units outputs the first drive current, the magnitude of which is 30% of the current required for the target light-emitting device, to the target light-emitting device, and the other of the two drive units outputs the first drive current, the magnitude of which is 70% of the current required for the target light-emitting device, to the target light-emitting device.

The target light-emitting device herein is any of the light-emitting devices on the lamp panel.

The second drive unit is configured to output, in the case that the operating state of the first drive unit is abnormal, a second drive current to the target light-emitting device to drive the lamp panel to display the target image. For the same light-emitting device, the second drive current output by the second drive unit is equal to the sum of the first drive currents output by the two drive units.

It should be noted that in the case that the drive display system includes more than two drive units, one or more second drive units are arranged, and the second drive unit includes at least one of the drive units that is driving the lamp panel to emit light and a drive unit that is not driving the lamp panel to emit light.

In the case that the display drive system operates normally, the lamp panel is driven, simultaneously by the two drive units, to emit light. In this way, in the case that the operating state of one of the drive units is abnormal, it is only necessary to stop the operation of the abnormal drive unit and increase the drive current output by the other drive unit with a normal operating state, such that the lamp panel still emits light according to a state when the operating state of the two drive units is normal. Because the second drive unit always drives the lamp panel to emit light during the process of switching the first drive unit to the second drive unit, the display image of the lamp panel is not interrupted, which is conducive to seamless switching of the display effect, and the display effect is further ensured.

In some examples, at least one of the two drive units 201 is further configured to fine-tune the display effect of the lamp panel by adjusting the drive current output to the target light-emitting device. For example, in the case that one of the drive units outputs the drive current of a constant magnitude to the target light-emitting device, the drive current output by one of the drive units to the target light-emitting device is increased or decreased by a defined value. In the case that a current adjustment granularity (i.e., a minimum adjustment amount employed for each adjustment, e.g., 5% of a maximum drive current corresponding to each of the drive ICs) corresponding to each of the drive ICs is constant and a maximum value of the current required for the target light-emitting device is constant, the two drive units independently output the drive currents to the target light-emitting device, such that adjustable ratings of the brightness of the target light-emitting device are more, and thus the display effect of the lamp panel is adjusted more finely.

In a second possible implementation, the two drive units 310 simultaneously drive the lamp panel to emit light, such that the lamp panel displays the target screen, each drive unit 310 is connected to a portion of the light-emitting units in the lamp panel, and the light-emitting units connected by different drive units 310 are different. That is, all the light-emitting units contained in the lamp panel are divided into a plurality of light-emitting unit groups, and different light-emitting unit groups are connected to different drive units 310. The light-emitting units in each light-emitting unit group are evenly distributed on the entire lamp panel.

In the case that the two drive units 310 simultaneously drive the lamp panel to emit light, the two drive units 310 are configured to output a first drive current to the light-emitting devices in the respective light-emitting units corresponding to the target screen, so as to drive the light-emitting devices of the lamp panel to emit light. Each drive unit 310 outputs the first drive current to the connected light-emitting units, and the two light-emitting unit groups jointly display the target screen. In the case that the first drive unit is abnormal, a second drive current may be output to the connected light-emitting units through the second drive unit, so as to drive the connected light-emitting unit to emit light and display the target screen, i.e., the target screen is displayed separately by the light-emitting unit group corresponding to the second drive unit.

In the case that the target screen is displayed separately by the light-emitting unit group corresponding to the second drive unit, compared with the two light-emitting unit groups jointly displaying the target screen, as the number of light-emitting units is reduced, it is necessary to increase the brightness of each light-emitting unit, that is, the second drive current is greater than the first drive current, for example, for the same light-emitting device, the second drive current is twice the first drive current.

As the second drive unit always drives the light-emitting units corresponding to the light-emitting panel during the entire display process, the display screen of the lamp panel will not be interrupted, which is conducive to achieving seamless switching of the display effect and further ensuring the display effect.

Optionally, the light-emitting units in each light-emitting unit group are arranged alternately in a first direction and/or a second direction.

In a third possible implementation, the drive unit driving the lamp panel to emit light includes only one drive unit 310, and the drive unit 310 is connected to each of the light-emitting units in the lamp panel. That is, at the same moment, the lamp panel is driven, by only one drive unit 310, to emit light. In this case, the drive unit 310 is configured to drive the lamp panel to display the target image by outputting the first drive current to the light-emitting devices in each of the light-emitting units corresponding to the target image. The second drive unit is configured to output, in the case that the operating state of the first drive unit (i.e., the drive unit that is operating) is abnormal, the second drive current to the light-emitting devices in each of the light-emitting units corresponding to the target image. The second drive current and the first drive current that are output to the same light-emitting device are equal.

In the embodiments, in the case that the first drive unit is abnormal, the lamp panel is driven by the second drive unit to emit light, such that the lamp panel is quickly restored to display images without waiting to emit light normally until the first drive unit is repaired.

The structure of the display drive system according to some embodiments of the present disclosure is described hereinafter in conjunction with FIG. 4. Each of the drive units 310 includes a plurality of drive ICs 311, and each of the drive ICs 311 is configured to drive the light-emitting units 111 in one of the light-emitting unit sub-arrays to emit light. For any of the light-emitting unit sub-arrays, a corresponding drive IC 311 exists in each of the drive units 310. That is, each of the light-emitting unit arrays is connected to two of the drive ICs 311 that respectively belong to different drive units 310.

In one possible implementation, each drive IC 311 is connected to each light-emitting unit corresponding to one light-emitting unit sub-array, respectively.

In another possible implementation, each drive unit IC 311 is connected to a portion of the light-emitting units in the corresponding light-emitting unit sub-array. That is, the light-emitting units in each light-emitting unit sub-array are divided into two groups, each light-emitting unit group is connected to one drive IC 311, and the drive ICs 311 connected to different light-emitting unit groups are different. Two light-emitting unit groups in the same light-emitting unit sub-array are arranged separately or interspersed.

Exemplarily, each light-emitting unit sub-array includes a plurality of light-emitting unit sets arranged in an array. Each light-emitting unit set includes a plurality of light-emitting units, and the number of light-emitting units in each light-emitting unit set can be the same. In this way, all light-emitting units included in the lamp panel include a plurality of light-emitting unit sets arranged in an array, and the number of light-emitting unit sets included in the lamp panel is equal to the sum of the number of light-emitting unit sets included in each light-emitting unit sub-array. Each light-emitting unit set corresponds to one pixel in the target screen. That is, the plurality of light-emitting units in each light-emitting unit set emit light to display the pixel.

Each of the light-emitting unit sets includes at least two subsets, each subset includes at least one light-emitting unit, and the light-emitting units in different subsets are connected to different drive units. In this way, when the light-emitting units in one subset fail, the light-emitting units in other subsets can still emit light normally, such that the corresponding pixels are displayed normally.

In each light-emitting unit set, the light-emitting units in each subset are arranged alternately in the first direction and/or the second direction. In this way, when the light-emitting units in one subset fail, the light-emitting units in other subsets are still scattered in the light-emitting unit set to avoid the adverse effects of large-area light-emitting units on the display effect.

Figure 4:
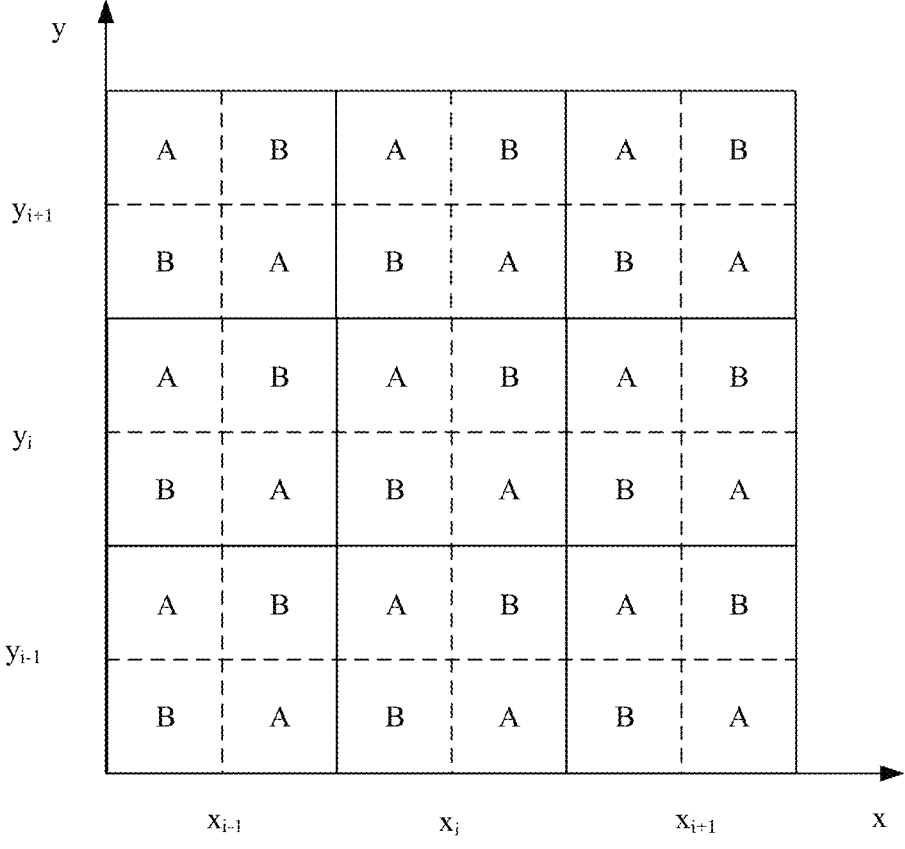
FIG. 4 is a distribution schematic diagram of a portion of light-emitting units according to some embodiments of the present disclosure.

Exemplarily, as shown in FIG. 4, each solid-line rectangular box represents a light-emitting unit set. In each light-emitting unit set, the light-emitting units corresponding to the letter A belong to a subset and are connected to one drive unit; the light-emitting units corresponding to the letter B belong to another subset and are connected to another drive unit. The letters A and B are arranged alternately in the first and second directions. That is, each light-emitting unit set includes two subsets, each subset includes two light-emitting units, and the light-emitting units in each subset are arranged alternately in the first and second directions.

In some embodiments, the number of light-emitting units in each light-emitting unit set is an integer multiple of the number of drive units, such that in each light-emitting unit set, the number of light-emitting units connected to each drive unit is equal. For example, when the number of drive units is 2, the number of light-emitting units in the light-emitting unit set is an even number, such as 2, 4, or 6, etc.

In some embodiments of the present disclosure, each of the drive units 310 includes a plurality of drive IC groups. Each of the drive IC groups includes a plurality of drive ICs 311 arranged along a first direction x, and the drive IC groups of the two drive units are arranged alternately in a second direction y. In this way, two drive ICs 311 driving the same light-emitting unit sub-array are arranged near the corresponding light-emitting unit sub-array, which is convenient for the wiring.

Figure 5:
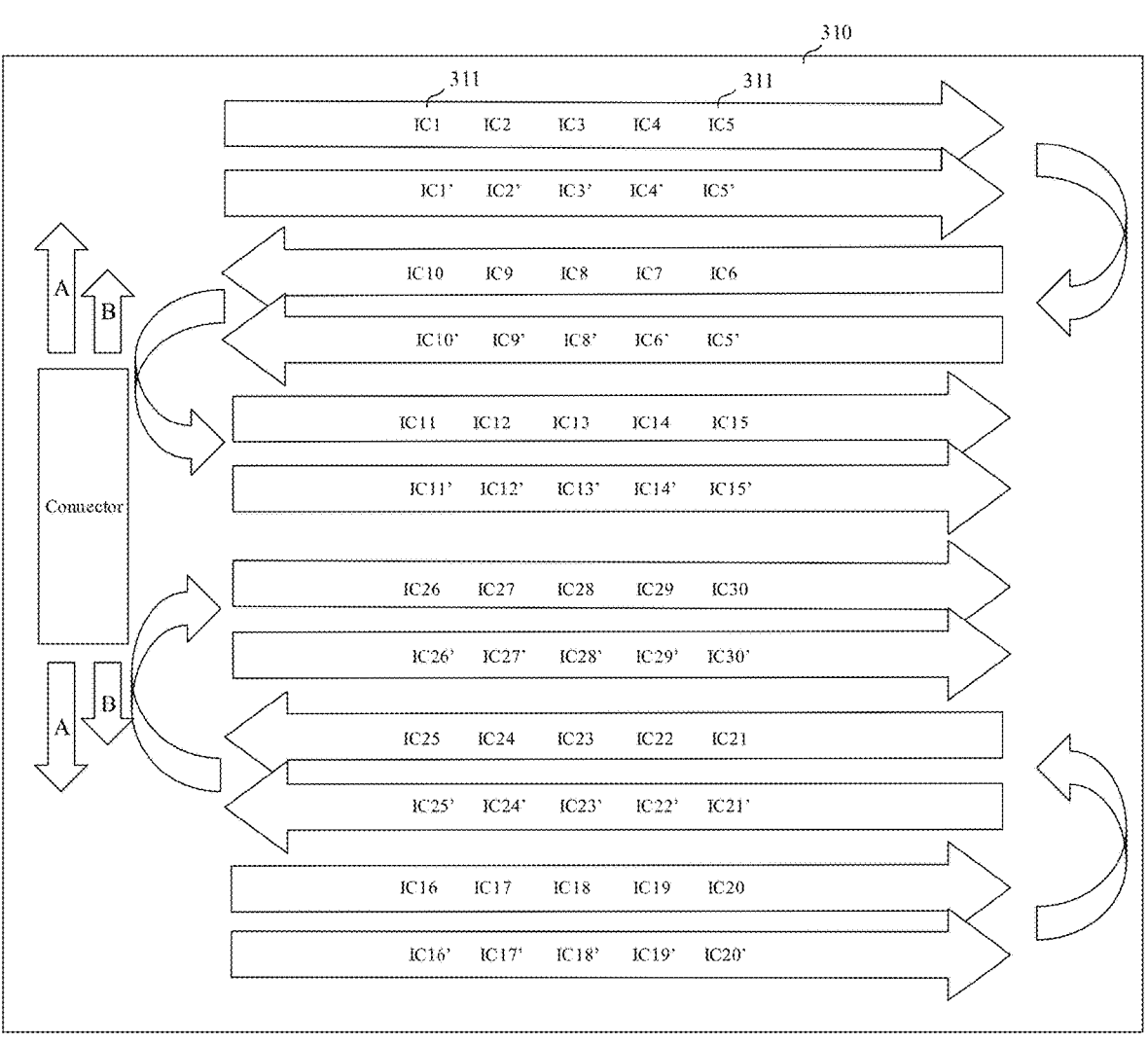
FIG. 5 is another structural schematic diagram of a drive unit of a display drive system according to some embodiments of the present disclosure.

For example, as illustrated in FIG. 5, one of the drive units includes drive ICs 1-30, and another one of the drive units includes drive ICs 1'-30'. Drive ICs 1-5, drive ICs 6-10, drive ICs 11-15, drive ICs 16-20, drive ICs 21-25, and drive ICs 26-30 are each organized into one of the drive IC groups. Similarly, drive ICs 1'-5 ', drive ICs 6'-10', drive ICs 11'-15', drive ICs 16'-20', drive ICs 21'-25', and drive ICs 26'-30' are each organized into one of the drive IC groups. The five drive ICs in the same drive IC group are arranged in a left-right direction, and all of the drive IC groups of the two drive units are arranged alternately in an up-down direction.

The drive unit further includes a plurality of signal lines, and each of the drive ICs is connected to at least one of the signal lines. The plurality of signal lines include at least one of a control line, a data line, or a power supply line. The control line includes, but is not limited to, a clock (DCLK) signal line, a clock data latch (LE) signal line, and a line feed (ROW) signal line. The number of signal lines is arranged to be one or more according to actual needs, which is not limited herein.

In some examples, the second surface of the substrate is divided into at least two regions arranged along the second direction. Two groups of signal lines and the plurality of drive ICs are arranged within each of the regions, and each group of signal lines is connected to the plurality of drive ICs belonging to one of the drive units. For example, as illustrated in FIG. 5, the second surface of the substrate is divided into two regions arranged along the second direction. The drive ICs 1-15 in the drive unit A and the drive ICs 1'-15' in the drive unit B are disposed in one of the two regions; and the drive ICs 16-30 in the drive unit A and the drive ICs 16'-30' in the drive unit B are disposed in the other of the two regions. The drive ICs 1-15, the drive ICs 1'-15', the drive ICs 16-30, and the drive ICs 16'-30' are respectively connected to a group of signal lines.

With the increase of a display area of the display device, the number of drive ICs in each of the drive units increases. In the case that all of the drive ICs in one of the drive units are connected to a group of signal lines, the transmission of signals over the corresponding signal lines does not meet the performance requirements due to the limitation of a transmission distance, such that the display effect is affected. Therefore, in the embodiments of the present disclosure, lengths of the signal lines are shortened by connecting the plurality of drive ICs belonging to the same drive unit in each of the regions to a group of signal lines, such that the signals are transmitted normally over the corresponding signal lines.

Referring to FIG. 5, each group of signal lines is connected to the drive ICs in the plurality of drive IC groups, and the plurality of drive IC groups connected to each group of signal lines are spaced apart along the second direction. To facilitate the wiring of the signal lines, the signal lines are routed in a Z-shape pattern. For example, as a direction illustrated by the arrow in FIG. 5, the signal lines corresponding to the drive ICs 1-15 first extend from left to right, then extend downward for a section, then extend from right to left, then extend downward for a section, and then extend from left to right.

As described above, each of the drive ICs is connected to each of the light-emitting units in the corresponding light-emitting unit sub-array. A way in which each of the drive ICs is connected to the corresponding light-emitting unit is described hereinafter.

Figure 6:
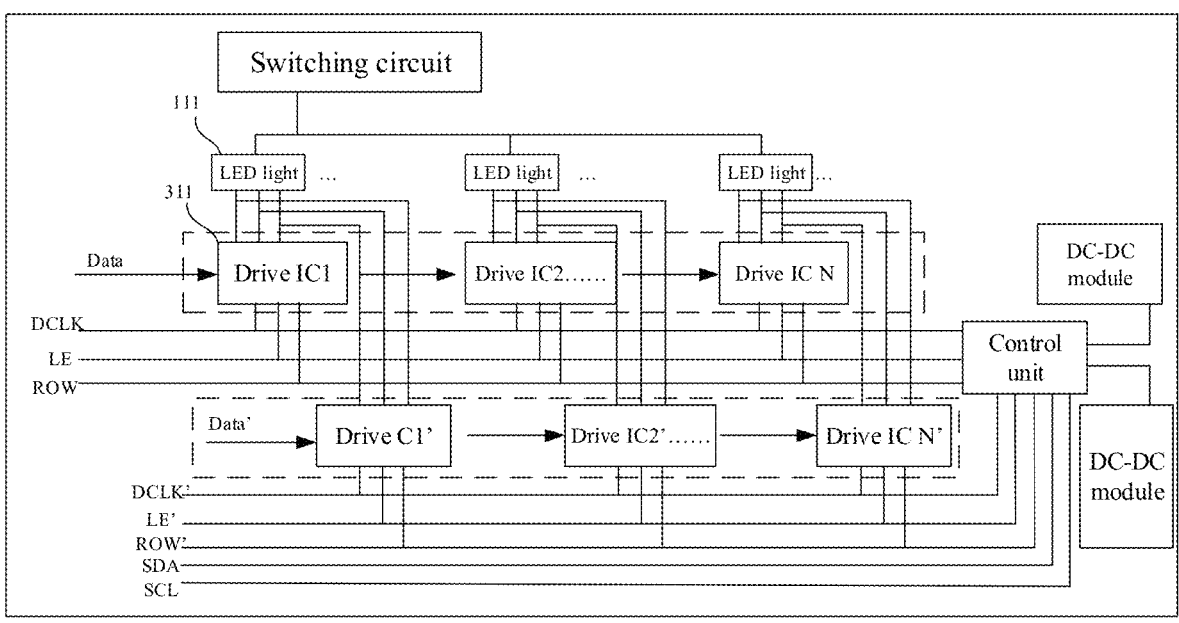
FIG. 6 is a schematic diagram of a connection of a drive IC, a signal line, and a light-emitting unit according to some embodiments of the present disclosure.

FIG. 6 is a schematic diagram of a connection of a drive IC, a signal line, and a light-emitting unit according to some embodiments of the present disclosure. An illustration is given in FIG. 6 using a scenario where the light-emitting unit is an LED lamp as an example. Each of the light-emitting units includes three of the light-emitting devices, and first electrodes (e.g., anodes) of the light-emitting devices of each row of light-emitting units are connected to a switch circuit on the lamp panel. The switch circuit is configured to control the light-emitting unit array to operate according to a row-scanning mode. The switch circuit includes a plurality of switch devices, and each of the switch devices is connected to the first electrode of each of the light-emitting devices in a row of light-emitting units. In the case that the switch device is on, the row of light-emitting devices is lit. Exemplarily, the switch device is a transistor. A control electrode of the transistor is connected to a scanning signal line, a first electrode of the transistor is connected to a power supply signal line, and a second electrode of the transistor is connected to the light-emitting devices in a row of light-emitting units.

As illustrated in FIG. 6, each of the drive ICs 311 includes a plurality of input pins and a plurality of output pins. Each of the input pins is correspondingly connected to one of the signal lines. Each of the drive ICs 311 is connected to the plurality of control lines, and the plurality of drive ICs are connected in series by one of the data lines. The data line is configured to transmit serial data, and the drive IC acquires corresponding image data by acquiring, based on configuration information, data of the corresponding position in the serial data.

Because each of the light-emitting units includes three of the light-emitting devices, the three output pins of the drive IC in FIG. 6 are connected to one of the light-emitting units. Each of the output pins is configured to connect to a first electrode (e.g., a cathode) of one of the light-emitting devices through one drive line. The drive IC 311 is configured to output, based on a signal input from the signal line, the drive current from a target output pin to drive the light-emitting device connected to the target output pin to emit light.

Exemplarily, assuming that each of the light-emitting units includes three light-emitting devices of different colors and each of the drive ICs includes sixteen output pins, each of the light-emitting units is connected to the light-emitting devices in five adjacent light-emitting units in the same row of light-emitting units (i.e., fifteen light-emitting devices), and the remaining one output pin is vacant. In the case that the display drive system drives the lamp panel to emit light employing zone scanning, assuming that each of the drive ICs corresponds to eight scans, each of the drive ICs is connected to the light-emitting devices in the corresponding five light-emitting units in each of eight rows of light-emitting units at the same time. In this way, each of the drive ICs is configured to drive a light-emitting unit sub-array of eight rows and five columns to emit light.

In some embodiments of the present disclosure, the control unit 320 is connected to at least one of the signal lines, such as being connected to all of the signal lines, and is configured to determine, based on state information of a signal on each of the signal lines, the operating state of the drive unit that is operating. Exemplarily, the state information of the signal is configured to indicate whether the signal on the signal line is abnormal. In the case that the signal on the signal line is abnormal, the operating state of the corresponding drive unit is abnormal; and in the case that the signal on the signal line is normal, the operating state of the corresponding drive unit is normal.

Exemplarily, at least one of the following implementations is employed by the control unit 320 to determine whether the signal on the signal line is abnormal.

In a first implementation, whether a duration, during which a level state of the signal is unchanged, exceeds a first defined duration is determined. In the case that the duration exceeds the first defined duration, the signal is abnormal;

and in the case that the duration does not exceed the first defined duration, the signal is normal.

In a second implementation, whether a duration, during which a level signal is not transmitted over the signal line, exceeds a second defined duration is determined. In the case that the duration exceeds the second defined duration, the signal is abnormal; and in the case that the duration does not exceed the second defined duration, the signal is normal.

In a third implementation, whether a jump amplitude of the signal transmitted over the signal line exceeds a jump amplitude threshold is determined. In the case that the jump amplitude of the signal exceeds the jump amplitude threshold, the signal is abnormal; and in the case that the jump amplitude of the signal does not exceed the jump amplitude threshold, the signal is normal.

In a fourth implementation, whether an amplitude of the signal transmitted over the signal line exceeds an amplitude threshold is determined. In the case that the amplitude of the signal exceeds the amplitude threshold, the signal is abnormal; and in the case that the amplitude of the signal does not exceed the amplitude threshold, the signal is normal.

The first defined duration and the second defined duration are defined according to actual needs, which are not limited herein.

In the embodiments of the present disclosure, the control unit 320 is connected to at least one drive line, for example, all drive lines, for determining whether the light-emitting device and/or the light-emitting unit connected by the drive line is faulty according to the status information of the signal of each drive line. Exemplarily, the status information of the signal on the drive line is used to indicate whether there is an abnormality in the signal on the drive line. In the case that there is an abnormality in the signal on the drive line, it indicates that the operating state of the corresponding light-emitting device is abnormal. In the case that there is no abnormality in the signal on the drive line, it indicates that the operating state of the corresponding light-emitting device is normal. As the LED is a current drive device, the status information of the signal may refer to the magnitude of the drive current.

Exemplarily, the control unit 320 may determine whether there is an abnormality in the signal on the drive line in at least one of the following modes:

In a first mode, whether a duration of the drive current unchanged exceeds a third defined duration. In the case that the duration of the drive current unchanged exceeds the third defined duration, it means that the signal is abnormal; and in the case that the duration of the drive current unchanged does not exceed the third defined duration, it means that there is no abnormality in the signal.

In a second mode, whether the duration of the drive current is less than the minimum current value exceeds the fourth defined duration. In the case that the duration of the drive current less than the minimum current value exceeds the fourth defined duration, it means that the signal is abnormal; and in the case that the duration of the drive current less than the minimum current value does not exceed the fourth defined duration, it means that there is no abnormality in the signal.

In a third mode, whether the size of the drive current is greater than the maximum current value. In the case that the size of the drive current is greater than the maximum current value, it means that the signal is abnormal; and in the case that the size of the drive current is not greater than the maximum current value, it means that there is no abnormality in the signal.

The third defined duration and the fourth defined duration can be set according to actual needs, which are not limited in the present disclosure.

In some embodiments of the present disclosure, the drive unit 310, the control unit 320, and the signal line 330 are disposed on the same substrate. Exemplarily, the control unit 320 is implemented by employing a microcontroller unit (MCU), a complex programmable logic device (CPLD), or a field programmable gate array (FPGA), which is not limited herein.

In the embodiments of the present disclosure, the display drive system further includes a power supply unit. The power supply unit is connected to the plurality of drive units, respectively, so as to supply power for the plurality of drive units.

Figure 7:
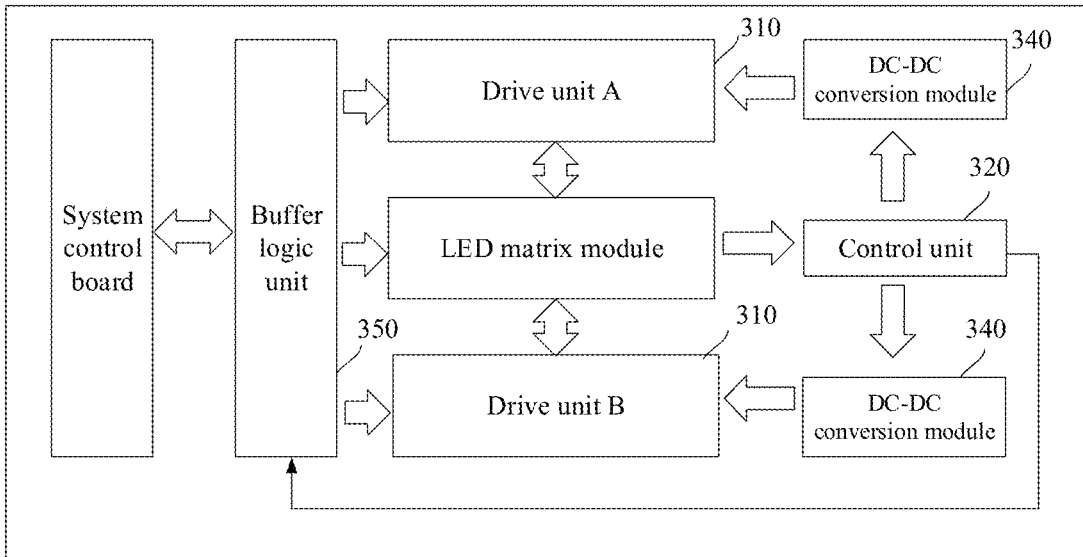
FIG. 7 is yet another structural schematic diagram of a display drive system according to some embodiments of the present disclosure.

FIG. 7 is yet another structural schematic diagram of a display drive system according to some embodiments of the present disclosure. As illustrated in FIG. 7, the power supply unit includes two power supply sub-units 340, each power supply sub-unit 340 is connected to one drive unit 310 for powering the connected drive unit 310.

Exemplarily, each of the power supply sub-units 340 is a direct current-direct current (DC-DC) conversion module. A control terminal (an enable terminal) of the DC-DC conversion module is connected to the control unit 320. During the display stage, the control unit 320 controls the two DC-DC conversion modules to operate, such that the two drive units 310 drive the lamp panel to emit light. In the case that the control unit 320 detects that the operating state of the first drive unit is abnormal, the control unit 320 controls the DC-DC conversion module corresponding to the first drive unit to stop operating, such that the first drive unit stops operating, and meanwhile, the control unit 320 maintains another DC-DC conversion module to supply power to the second drive unit. Moreover, the control unit 320 feeds fault information back to a system control device (e.g., a system control board), such that the system control device adjusts a data signal transmitted to the second drive unit, and thus the drive IC in the second drive unit increases the drive current output to the target light-emitting device. In this way, the switching from two drive units to jointly drive the lamp panel to emit light to the second drive unit to drive the lamp panel to emit light is implemented.

Figure 8:
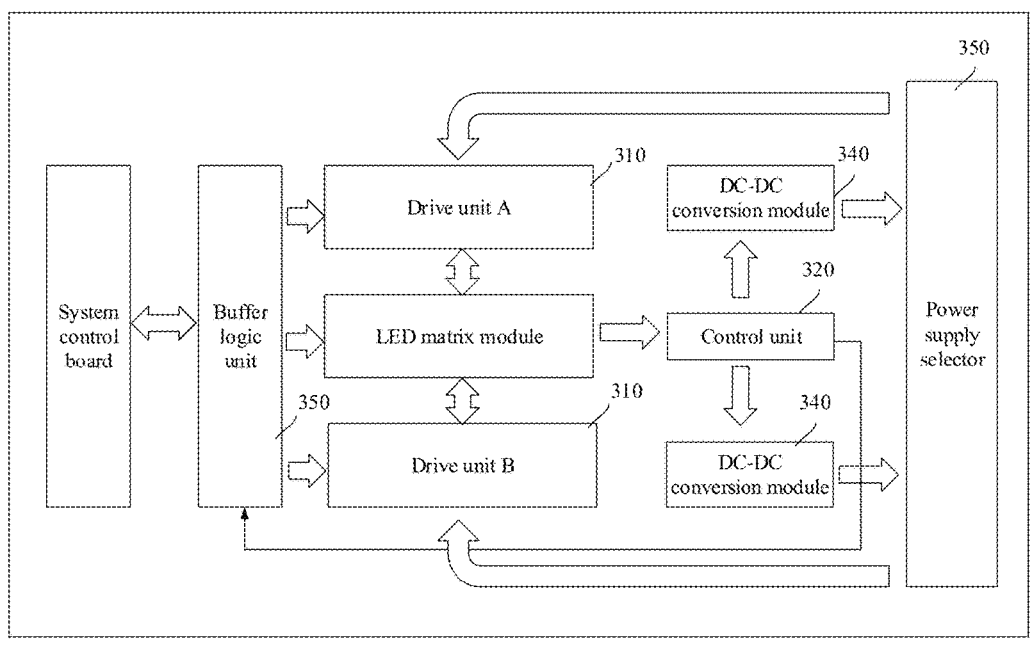
FIG. 8 is still another structural schematic diagram of a display drive system according to some embodiments of the present disclosure.

FIG. 8 is still another structural schematic diagram of a display drive system according to some embodiments of the present disclosure. As shown in FIG. 8, the power supply unit includes a power supply selector 350 and a plurality of power supply sub-units 340. The power supply selector 350 is connected to the plurality of power supply sub-units 340 and the plurality of drive units 310, respectively. The power supply selector 350 is configured to receive voltages provided by the plurality power supply sub-units 340, and to output a higher voltage among the received voltages provided by the plurality of power supply sub-units 340 to the plurality of drive units 310. The power supply selector 350 may be referred to as a parallel power supply selector.

In the case that each power sub-unit 340 can work normally, the voltage provided by each power sub-unit 340 is equivalent. At this time, the voltage output by the power supply selector 350 is equivalent to the voltage provided by any power supply sub-unit 340, and each power supply sub-unit 340 jointly supplies power to each drive unit 310. In the case that a certain power supply sub-unit 340 fails and the voltage output by the power supply sub-unit 340 is abnormal (for example, 0), the power supply selector 350 selects a power supply sub-unit 340 with a higher voltage to supply power to each drive unit 310. By setting the power supply selector in the power supply unit, when any power supply sub-unit fails, it is possible to ensure that each drive unit can work normally, thereby further improving reliability.

Exemplarily, each power supply sub-unit 340 is a DC-DC conversion module. The difference from the embodiments shown in FIG. 7 is that in the embodiments shown in FIG. 8, the DC-DC conversion module may be connected to the control unit 320 or not.

Figure 9:
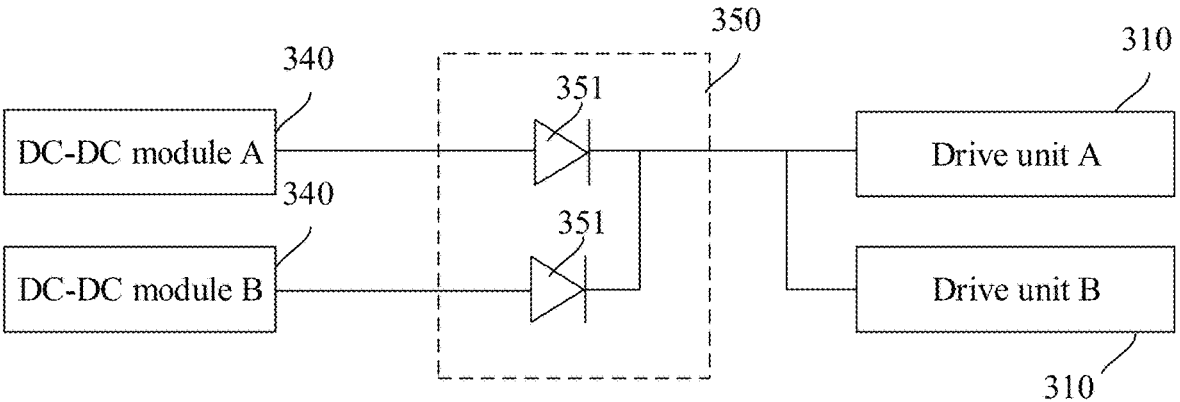
FIG. 9 is a structural schematic diagram of a power supply selector according to some embodiments of the present disclosure.

FIG. 9 is a structural schematic diagram of a power supply selector according to some embodiments of the present disclosure. As shown in FIG. 9, the power selector 350 includes a plurality of diodes 351. The anode of each diode 351 is connected to an output terminal of one power subunit 340, and the power supply sub-units 340 connected to different diodes 351 are different, and the cathodes of the plurality of diodes 351 are connected and respectively connected to the respective drive units 310.

The type of diode is not limited in the embodiments of the present disclosure, a Schottky diode or a switching diode may be used.

It should be noted that in the embodiments, as the power supply selector outputs the higher voltage among the received voltages provided by the plurality of power subunits 340 to each drive unit 310, the power supply sub-unit 340 and the drive unit 310 does not have a correspondence relationship, the first drive unit cannot be stopped by stopping the power supply to the first drive unit. The data signal transmitted to the first drive unit needs to be adjusted by the system control device, such that the first drive unit stops driving the connected light-emitting units to emit light.

In practice, the control unit 320 feeds back the fault information to the system control device (such as the system control board), such that the system control device adjusts the data signal transmitted to the first drive unit and the data signal transmitted to the second drive unit, and the drive ICs in the first drive unit stops outputting the drive current, and enables the drive ICs in the second drive unit to increase the drive current. In this way, the switching from the two drive units that jointly drive the lamp panel to emit light to the second drive unit that drives the lamp panel to emit light is completed.

The fault information includes, but is not limited to, a fault time, a fault content, and a fault location. The fault time is configured to indicate a time when the fault is detected, the fault content is configured to indicate a type of abnormality of the signal on the signal line (e.g., the duration during which the level state of the signal is unchanged exceeds the first defined duration, the duration during which the level signal is not transmitted over the signal line exceeds the second defined duration, and the like), and the fault location is configured to indicate the faulted drive unit.

In some examples, the display drive system further includes a buffer logic unit 350. The buffer logic unit 350, the drive unit 310, and the control unit 320 are disposed on the same substrate. The buffer logic unit 310 is connected to the system control device and is connected to the control unit 320 and the drive unit 310 by the signal line 330. In this way, the buffer logic unit 350 is capable of acting as the signal level conversion and/or data buffering between the system control device, the control unit 310, and the drive unit 320.

In the embodiments of the present disclosure, for the aforementioned second possible implementation (that is, the implementation corresponding to FIG. 4), the display drive system can also adjust, in response to a faulty light-emitting unit existing, the brightness of a portion of the light-emitting units close to the faulty light-emitting unit, thereby improving the display effect. The following still takes the display drive system including two drive units as an example for description.

In one possible implementation, the two drive units are configured to output, during the display stage, a first drive current to light-emitting devices of each light-emitting unit to drive the lamp panel to display the target screen. Here, each drive unit outputs the first drive current to the light-emitting devices of the light-emitting unit in the corresponding light-emitting unit group.

The two drive units are further configured to stop, in response to a faulty light-emitting unit existing in a first light-emitting unit set, outputting a drive current to light-emitting devices of a light-emitting unit in a first subset in the first light-emitting unit set, and output a second drive current to light-emitting devices of a light-emitting unit in a second subset to drive the lamp panel to display the target picture, the second drive current being greater than the first drive current. The first light-emitting unit set is any one of the plurality of light-emitting unit sets, and each light-emitting unit set corresponds to one pixel in the target picture. The first subset is a subset to which the faulty light-emitting unit belongs, and the second subset is a subset other than the first subset in the first light-emitting unit set.

For example, as shown in FIG. 4, in the light-emitting unit set (xi, yi), in the case that the light-emitting unit corresponding to the letter A fails, the light-emitting unit set (xi, yi) is the first light-emitting unit set, the subset to which the light-emitting unit corresponding to the letter A belongs is the first subset, and the subset to which the light-emitting unit corresponding to the letter B belongs is the second subset. The drive unit A stops outputting a drive current to light-emitting devices in the light-emitting unit corresponding to the letter A in the light-emitting unit set (xi, yi). The drive unit B outputs a second drive current to light-emitting devices in the light-emitting unit corresponding to the letter B in the light-emitting unit set (xi, yi) to drive the lamp panel to display the target screen. The second drive current is greater than the first drive current.

As the light-emitting units in the same light-emitting unit set are used for displaying a pixel in the target screen, under normal circumstances, the brightness of each light-emitting unit is equal to one-N of the brightness corresponding to the pixel, wherein N is equal to the number of light-emitting units in the light-emitting unit set. In the case that each subset includes a plurality of light-emitting units connected in series (i.e. light-emitting devices of the same color in each light-emitting unit of the same subset are connected in series), the first drive current output by the drive unit to each subset is half of the drive current required for the light-emitting unit set.

In the case that a faulty light-emitting unit exists in the first subset, the drive current is stopped outputting to the light-emitting devices of the light-emitting unit in the first subset, the light-emitting unit in the first subset does not emit light. In the case that the brightness of the light-emitting unit does not change, the overall brightness of the first light-emitting unit set decreases. To make the overall brightness change of the first light-emitting unit set small, the light-emitting devices of the light-emitting unit in the second subset output a second drive current greater than the first drive current.

Exemplarily, the second drive current is equal to twice the first drive current. In this way, the overall brightness of the first light-emitting unit set can remain unchanged.

In practice, the control unit detects the faulty light-emitting unit, feeds back the information of the faulty light-emitting unit to the system control device, and the system control device transmits a data signal to the drive unit corresponding to the first subset, such that the drive unit corresponding to the first subset stops outputting a drive current to the light-emitting unit in the first subset; at the same time, transmits a data signal to the drive unit corresponding to the second subset, such that the drive unit corresponding to the second subset outputs a second drive current to the light-emitting devices of the light-emitting unit in the second subset.

Optionally, the two drive units are further configured to output, in response to the faulty light-emitting unit existing in the first light-emitting unit set, a third drive current to light-emitting devices in a light-emitting unit adjacent to the first light-emitting unit set in a second light-emitting unit set, the third drive current being different from the first drive current. The second light-emitting unit set is adjacent to the first light-emitting unit set, and a brightness difference between brightness values of each color corresponding to the first light-emitting unit set and the second light-emitting unit set satisfies a defined condition. The defined condition included the brightness difference being less than a difference threshold, or a ratio of the brightness difference to a brightness value of the corresponding color in the second light-emitting unit set being less than a ratio threshold.

In the case that the brightness difference between brightness values of each color corresponding to the first light-emitting unit set and the second light-emitting unit set satisfies the defined condition, it indicates that the pixel points corresponding to the first light-emitting unit set and the second light-emitting unit set in the target screen have the same or similar pixel contents, for example, the absolute value of the difference between the two pixels is less than the difference threshold. In this case, in the case that the brightness of the light-emitting units in the second light-emitting unit set remains unchanged, and the brightness of the light-emitting units in the second subset of the first light-emitting unit set increases, the brightness difference degree between these two will increase, which will harm the brightness uniformity of the display effect. In this case, it is necessary to adjust the drive current of the light-emitting devices of the light-emitting unit adjacent to the first light-emitting unit set in the second light-emitting unit set, so as to improve brightness uniformity.

Optionally, both the ratio threshold and the difference threshold can be set according to actual needs, which are not limited in the present disclosure. For example, the ratio threshold is 20% to 40%, such as 30%, etc.

Exemplarily, the two drive units are further configured to output, in response to the faulty light-emitting unit existing in the first light-emitting unit set, a third drive current that is greater than the first drive current to light-emitting devices of a first target light-emitting unit in the second light-emitting unit set, wherein the first target light-emitting unit is adjacent to the light-emitting unit in the first subset; and/or, the two drive units are further configured to output, in response to the faulty light-emitting unit existing in the first light-emitting unit set, a third drive current that is less than the first drive current to light-emitting devices of a second target light-emitting unit in the second light-emitting unit set, wherein the second target light-emitting unit is adjacent to the light-emitting unit in the second subset.

As the light-emitting unit in the first subset does not emit light, to avoid a high display contrast difference, it is necessary to increase the brightness of the light-emitting unit adjacent thereto. Therefore, the light-emitting devices of the light-emitting unit adjacent to the first subset in the second light-emitting unit set output a third drive current greater than the first drive current. However, in the case that the brightness of the light-emitting unit in the second subset increases, to avoid a high display contrast difference, it is necessary to reduce the brightness of the light-emitting unit adjacent thereto. Therefore, a third drive current smaller than the first drive current is output to the light-emitting devices of the light-emitting unit adjacent to the second subset in the second light-emitting unit set.

For example, as shown in FIG. 4, the light-emitting unit set (xi−1, yi−1) is adjacent to the light-emitting unit set (xi, yi), and is the second light-emitting unit set. In the light-emitting unit set (xi−1, yi−1), the light-emitting unit corresponding to the letter B is adjacent to the first subset in the light-emitting unit set (xi, yi), and the light-emitting unit in the first subset does not emit light. Therefore, it is necessary to increase the brightness of the light-emitting unit corresponding to the letter B in the light-emitting unit set (xi−1, yi−1).

For another example, as shown in FIG. 4, the light-emitting unit set (xi−1, yi) is adjacent to the light-emitting unit set (xi, yi), and is the second light-emitting unit set. In the light-emitting unit set (xi−1, yi), the light-emitting unit corresponding to the letter A is adjacent to the light-emitting unit in the first subset in the light-emitting unit set (xi, yi), and the light-emitting unit in the first subset does not emit light. Therefore, it is necessary to increase the brightness of the light-emitting unit corresponding to the letter A in the light-emitting unit set (xi−1, yi). In the light-emitting unit set (xi−1, yi), the light-emitting unit corresponding to the letter B is adjacent to the light-emitting unit in the second subset of the light-emitting unit set (xi, yi), and the brightness of the light-emitting unit in the second subset increases. Therefore, it is necessary to reduce the brightness of the light-emitting unit corresponding to the letter B in the light-emitting unit set (xi−1, yi).

In practice, it is necessary to determine whether each light-emitting unit set adjacent to the first light-emitting unit set satisfies the aforementioned defined condition, and adjust the drive current corresponding to the light-emitting unit set satisfying the defined condition.

Optionally, an absolute value of a difference between the third drive current and the first drive current is positively correlated with the first drive current, and negatively correlated with the ratio.

Exemplarily, the difference between the third drive current and the first drive current can be determined using the following equation (1):

$$\Delta I = 0.25I(1 - \Delta E) \tag{1}$$

In formula (1), $\Delta I$ represents the difference between the third drive current and the first drive current, that is, the current adjustment value of the light-emitting unit, I represents the first drive current, $\Delta E$ represents a ratio of a brightness difference between brightness values of a color corresponding to the first light-emitting unit set and the second light-emitting unit set to a brightness value of a color corresponding to the second light-emitting unit set.

As can be seen from the formula (1), the larger the ratio, the smaller the difference between the third drive current and the first drive current; and the smaller the ratio, the larger the difference between the third drive current and the first drive current.

It should be noted that in this formula, 0.25 is an adjustment factor, and the adjustment factor can be changed according to actual needs, which is not limited in the embodiments of the present disclosure.

Exemplarily, $\Delta E$ can be determined using the following formula (2):

$$E = [\Delta R, \Delta G, \Delta B] = \left[ \left| \frac{R_i - R_j}{R_i} \right|, \; \left| \frac{G_i - G_j}{G_i} \right|, \; \left| \frac{B_i - B_j}{B_i} \right| \right] \tag{2}$$

In formula (2), Ri represents the red pixel value corresponding to the i-th light-emitting unit set, Rj represents the red pixel value corresponding to the j-th light-emitting unit set, Gi represents the green pixel value corresponding to the i-th light-emitting unit set, Gj represents the green pixel value corresponding to the j-th light-emitting unit set, Bi represents the blue pixel value corresponding to the i-th light-emitting unit set, and Bj represents the blue pixel value corresponding to the j-th light-emitting unit set.

In the case that $\Delta E$ is smaller than the ratio threshold, it means that the pixel values of the pixels corresponding to the two light-emitting units are the same or similar, and the drive current of the second light-emitting unit set needs to be adjusted. In the case that $\Delta E$ is equal to 0, it means that the pixel values of the pixels corresponding to the two light-emitting unit sets are the same. At this time, the current adjustment value determined according to the formula (1) is the maximum. In the case that $\Delta E$ is greater than or equal to the ratio threshold, it means that the pixel values of the pixels corresponding to the two light-emitting unit sets are quite different. At this time, there is no need to adjust the drive current of the second light-emitting unit set.

Optionally, the two drive units are further configured to, in response to the faulty light-emitting unit existing in the first light-emitting unit set, a fourth drive current to light-emitting devices of a third target light-emitting unit in the second light-emitting unit set, wherein an absolute value of a difference between the fourth drive current and the first drive current is equal to an absolute value of a difference between the third drive current and the first drive current, and a symbol of the difference between the fourth drive current and the first drive current and a symbol of the difference between the third drive current and the first drive current are opposite. The third target light-emitting unit is not adjacent to the first light-emitting unit set, and the third target light-emitting unit and the light-emitting unit adjacent to the first light-emitting unit set belong to different subsets. That is, in the second light-emitting set, in the case that the drive current of the light-emitting unit in the subset where the light-emitting unit adjacent to the first light-emitting unit set is located increases, the drive current of the third target light-emitting unit is reduced; and in the second light-emitting set, in the case that the drive current of the light-emitting units in the subset where the light-emitting units adjacent to the first light-emitting unit set is located decreases, the drive current of the third target light-emitting unit is increased.

For example, as shown in FIG. 4, the light-emitting unit set (xi−1, yi−1) is adjacent to the light-emitting unit set (xi, yi), and is the second light-emitting unit set. In the light-emitting unit set (xi−1, yi−1), the light-emitting unit corresponding to the letter A is not adjacent to the light-emitting unit set (xi, yi), and the light-emitting unit corresponding to the letter A and the light-emitting unit corresponding to the letter B are different subsets, i.e., the light-emitting unit corresponding to the letter B is the third target light-emitting unit. As the brightness of the light-emitting unit corresponding to the letter B in the light-emitting unit set (xi−1, yi−1) decreases, it is necessary to increase the brightness of the light-emitting unit corresponding to the letter A in the light-emitting unit set (xi−1, yi−1), so as to ensure that the overall brightness of the light-emitting unit set (xi−1, yi−1) remains unchanged.

For another example, in FIG. 4, the light-emitting unit set (xi−1, yi+1) is adjacent to the light-emitting unit set (xi, yi), and is the second light-emitting unit set. In the light-emitting unit set (xi−1, yi+1), the light-emitting unit corresponding to the letter B is not adjacent to the light-emitting unit set (xi, yi), and the light-emitting unit corresponding to the letter B and the light-emitting unit corresponding to the letter A are different subsets, i.e., the light-emitting unit corresponding to the letter B is the third target light-emitting unit. As the brightness of the light-emitting unit corresponding to the letter A in the light-emitting unit set (xi−1, yi+1) increases, it is necessary to reduce the brightness of the light-emitting unit corresponding to the letter B in the light-emitting unit set (xi−1, yi+1), so as to ensure that the overall brightness of the light-emitting unit set (xi−1, yi+1) remains unchanged.

Due to the light-mixing effect of the light, after adjusting the brightness of the light-emitting units in the second light-emitting unit set in the above implementation, the color brightness uniformity of the displayed image can be effectively improved.

In some embodiments of the present disclosure, the display drive system is further configured to drive the lamp panel to display images during a fault detection stage, such that the fault is located in the case that the fault is present in the display drive system.

In some embodiments, each drive unit is connected to all the light-emitting units, one of the two drive units is configured to drive, during the fault detection stage, a light-emitting device, corresponding to a first color, in the plurality of light-emitting units to emit light; and the other of the two drive units is configured to drive, during the fault detection stage, a light-emitting device, corresponding to a second color, in the plurality of light-emitting units to emit light. The first color is different from the second color.

In each of the light-emitting units, one light-emitting device corresponding to the first color is arranged, and one light-emitting device corresponding to the second color is arranged. For example, the first color is red and the second color is blue; or, the first color is blue and the second color is green.

During the fault detection stage, the two drive units respectively drive the light-emitting devices corresponding to different colors in each of the light-emitting units of the lamp panel to emit light, such that each of the light-emitting units emits the light mixed with the light of the first color and light of the second color. Based on the color emitted by each of the light-emitting units on the lamp panel, whether the fault is present in the display drive system and the fault information in the event of the fault are determined. The fault information is configured to indicate the fault location, wherein the fault location includes, but is not limited to, the faulted drive unit and the faulted drive IC.

For example, in the case that each of the light-emitting units emits the light mixed with the light of the first color and the light of the second color, the display drive system is fault-free. For example, in the case that a portion of the light-emitting units only emits the light of the first color, the drive ICs for driving the light-emitting units to emit the light of the second color corresponding to the portion of the light-emitting units are faulted. Further, for example, in the case that a portion of the light-emitting units only emits the light of the second color, the drive ICs for driving the light-emitting units to emit the light of the first color corresponding to the portion of the light-emitting units are faulted.

The fault detection is more efficient by employing the two drive units to simultaneously drive, during the fault detection stage, the lamp panel to emit light.

In other embodiments, each drive unit is connected to all the light-emitting units, one of the plurality of drive units is configured to drive, during a first period of the fault detection stage, a light-emitting device, corresponding to a third color, in the plurality of light-emitting units to emit light, and stop driving, during a second period of the fault detection stage, the light-emitting device, corresponding to the third color, in the plurality of light-emitting units to emit light; and another one of the plurality of drive units is configured to drive, during the second period, a light-emitting device, corresponding to a fourth color, in the plurality of light-emitting units to emit light. The second period is a period following the first period.

Optionally, the third color and the fourth color are the same or different. In some examples, the third color is the same as a color of light emitted by a single light-emitting device, such as red, blue, or green; in other examples, the third color is the same as a color of mixed light emitted by the plurality of light-emitting devices in the same light-emitting unit, for example, the third color is purple, which is acquired by mixing light emitted by a light-emitting device emitting red light and light emitted by a light-emitting device emitting blue light.

The system control board is connected to the control unit 320 by an I2C bus (e.g., a serial clock (SCL) line and a serial data (SDA) line in FIG. 5) and transmits a fault detection instruction to the control unit 320 by the I2C bus. The fault detection instruction is configured to instruct the control unit 320 to enter the fault detection stage. Upon receiving the fault detection instruction, the control unit 320 enters the fault detection stage. During the fault detection stage, the system control board transmits voltage data, corresponding to a color to be displayed, to each of the drive ICs in the drive unit by a transmitter and a receiver, and the drive IC controls, based on the voltage data, the corresponding light-emitting device to emit light.

It should be noted that the system control board is connected to the control unit by other means, such as a serial peripheral interface (SPI) or an RS232.

It should be noted that for the case where the display drive system includes more than two drive units, reference is made to the case where the display drive system includes two drive units, which is not repeated herein.

Some embodiments of the present disclosure further provide a display device. The display device includes a lamp panel and a display drive system. The display drive system is configured to drive the lamp panel to emit light. For the detailed description of the display drive system, reference is made to the above embodiments, which is not repeated herein.

Exemplarily, the display device includes, but is not limited to, a display, a smartphone, a tablet computer, a laptop computer, and any other terminal device with a display function.

The display is a large outdoor display, such as a ground screen, a façade display screen, or various types of shaped creative screens. The display is especially suitable for scenes where the display cannot be interrupted, such as a large performance event.

Some embodiments of the present disclosure further provide a display drive method. The display drive method is performed by the control unit described above. As illustrated in FIG. 10, the display drive method includes the following steps.

In S1, during a display stage, a lamp panel is driven, by at least one of a plurality of drive units, to emit light, wherein the plurality of drive units are connected to the lamp panel.

In S2, an operating state of the drive units driving the lamp panel to emit light is detected.

In the embodiments of the present disclosure, the operating state includes a normal state and an abnormal state. The normal state indicates that the drive unit is capable of normally driving the lamp panel to emit light. The abnormal state indicates that the drive unit is not capable of normally driving the lamp panel to emit light, which leads to an abnormal display of the lamp panel.

In S3, in the case that the operating state of a first drive unit is abnormal, the lamp panel is driven, by a second drive unit, to emit light.

The first drive unit is at least one of the drive units driving the lamp panel to emit light, and the second drive unit is at least one of the drive units included in the drive display system other than the first drive unit.

In some embodiments, S1 includes: during the display stage, outputting first drive currents to a target light-emitting device by at least two of the drive units to drive the lamp panel to display a target image; accordingly, S3 includes: in response to the operating state of the first drive unit being abnormal, outputting a second drive current, by the second drive unit, to the target light-emitting device to drive the lamp panel to display the target image; wherein the target light-emitting device is any light-emitting device on the lamp panel, and a sum of the second drive currents output by the second drive currents is equal to a sum of the first drive currents output by the at least two of the drive units.

Optionally, magnitudes of the first drive currents output by the at least two of the drive units to the target light-emitting device are the same or different.

In other embodiments, S1 includes: during the display stage, outputting the first drive current to the target light-emitting device by one of the drive units to drive the lamp panel to display the target image; and S3 includes: in response to the operating state of the first drive unit being abnormal, outputting the second drive current, by the second drive unit, to the target light-emitting device to drive the lamp panel to display the target image; wherein the target light-emitting device is any light-emitting device on the lamp panel, and the second drive current is equal to the sum of the first drive currents.

Exemplarily, each of the drive units includes a plurality of drive ICs and a plurality of signal lines, wherein each of the signal lines is connected to the plurality of drive ICs; and wherein the operating state of the drive units driving the lamp panel to emit light being detected includes: detecting state information of signals on the plurality of signal lines; and determining, based on the state information of the signal, the operating state of the drive units driving the lamp panel to emit light.

In other embodiments, corresponding to the aforementioned second possible embodiment, S1 includes the following steps.

In a first step, a first drive current is output, during the display stage, to the light-emitting devices of each of the light-emitting units to drive the lamp panel to display a target screen.

In a second step, in response to a faulty light-emitting unit existing in a first light-emitting unit set, a drive current is stopped outputting to light-emitting devices of a light-emitting-unit in a first subset in the first light-emitting unit set, and output a second drive current to light-emitting devices of a light-emitting unit in a second subset to drive the lamp panel to display the target screen, the second drive current being greater than the first drive current.

The first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

In some embodiments, S1 further includes the following step.

In a third step, in response to the faulty light-emitting unit existing in the first light-emitting unit set, a third drive current is output to light-emitting devices of a light-emitting unit adjacent to the first light-emitting unit set in a second light-emitting unit set, the third drive current being different from the first drive current. The second light-emitting unit set is adjacent to the first light-emitting unit set, and a brightness difference between brightness values of each color corresponding to the first light-emitting unit set and the second light-emitting unit set satisfies a defined condition, the defined condition comprising the brightness difference being less than a difference threshold, or a ratio of the brightness difference to a brightness value of corresponding color in the second light-emitting unit set being less than a ratio threshold.

In some embodiments, the third step includes: outputting a third drive current that is greater than the first drive current to light-emitting devices of a first target light-emitting unit in the second light-emitting unit set, wherein the first target light-emitting unit is adjacent to the light-emitting unit in the first subset; and/or, outputting a third drive current that is less than the first drive current to light-emitting devices of a second target light-emitting unit in the second light-emitting unit set, wherein the second target light-emitting unit is adjacent to the light-emitting unit in the second subset.

In some embodiments, S1 further includes: outputting, in response to the faulty light-emitting unit existing in the first light-emitting unit set, a fourth drive current to light-emitting devices of a third target light-emitting unit in the second light-emitting unit set, wherein an absolute value of a difference between the fourth drive current and the first drive current is equal to an absolute value of a difference between the third drive current and the first drive current, and a symbol of the difference between the fourth drive current and the first drive current and a symbol of the difference between the third drive current and the first drive current are opposite; wherein the third target light-emitting unit is not adjacent to the first light-emitting unit set, and the third target light-emitting unit and the light-emitting unit adjacent to the first light-emitting unit set belong to different subsets.

In some embodiments, the display drive method further includes: during a fault detection stage, driving, by one of the plurality of drive units, a light-emitting device, corresponding to a first color, in the plurality of light-emitting units to emit light; and during the fault detection stage, driving, by another one of the plurality of drive units, a light-emitting device, corresponding to a second color, in the plurality of light-emitting units to emit light; wherein the first color is different from the second color.

In other embodiments, the display drive method further includes: during a first period of the fault detection stage, driving, by one of the plurality of drive units, a light-emitting device, corresponding to a third color, in the plurality of light-emitting units to emit light; and during a second period of the fault detection stage, stopping driving the light-emitting device, corresponding to the third color, in the plurality of light-emitting units to emit light, and driving, by another one of the plurality of drive units, a light-emitting device, corresponding to a fourth color, in the plurality of light-emitting units to emit light.

FIG. 11 illustrates a fault detection process, applied to the display drive system shown in FIG. 7. As illustrated in FIG. 11, the fault detection process includes the following steps. In S81, a fault detection instruction is transmitted by a transmitter. In S82, the fault detection instruction is received by a receiver, a fault detection mode is entered, the fault detection instruction is transmitted to a detection unit, and detection data is transmitted to the drive unit, wherein the detection data corresponds to the color to be displayed. In S83, a first DC-DC conversion module is turned on and a second DC-DC conversion module is turned off by the control unit, wherein the first DC-DC conversion module and the second DC-DC conversion module are the two DC-DC conversion modules as described above. In S84, the lamp panel is driven by the drive unit connected to the first DC-DC conversion module to display the third color. In the case that a display of the color is abnormal, fault information is reported and the display device is sent to be repaired; and in the case that the display of the color is normal, S85 is performed. In S85, the second DC-DC converter module is turned on and the first DC-DC converter module is turned off by the control unit. In S86, the lamp panel is driven, by the drive unit connected to the second DC-DC converter module, to display the third color. In the case that the display of the color is abnormal, fault information is reported and the display device is sent to be repaired; and in the case that the display of the color is normal, the display device is fault-free, and the fault detection process is exited.

It should be noted that the display drive method is based on the same concept as the display drive system described above. For the relevant contents, reference is made to the display drive system as described above, which is not repeated herein.

Figure 12:
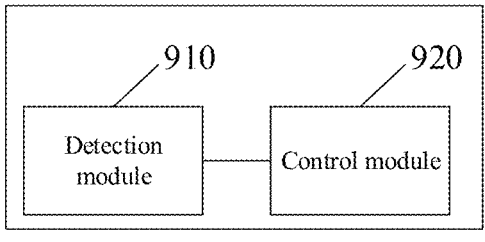
FIG. 12 is a structural schematic diagram of a display drive device according to some embodiments of the present disclosure.

Some embodiments of the present disclosure further provide a display drive device. As illustrated in FIG. 12, the display drive device includes a detection module 910 and a control module 920. The control module 920 is configured to drive, during a display stage by at least one of a plurality of drive units, a lamp panel to emit light, wherein the plurality of drive units are connected to the lamp panel. The detection module 910 is configured to detect an operating state of the drive units driving the lamp panel to emit light. The control module 920 is further configured to drive, in the case that the detection module 910 detects that the operating state of a first drive unit is abnormal, by a second drive unit, the lamp panel to emit light. The first drive unit is at least one of the drive units driving the lamp panel to emit light, and the second drive unit is at least one of the plurality of drive units other than the first drive unit.

In some embodiments, the control unit 920 is further configured to, during the display stage by at least two of the plurality of drive units, output first drive currents to a target light-emitting device to drive the lamp panel to display a target image. In the case that the operating state of the first drive unit is abnormal, to output, by the second drive unit, a second drive current to the target light-emitting device to drive the lamp panel to display the target image. The target light-emitting device is any light-emitting device on the lamp panel, and the sum of the second drive currents output by the second drive currents is equal to the sum of the first drive currents output by the at least two of the drive units.

Optionally, the detection module 910 is further configured to detect state information of signals on a plurality of signal lines; and determine, based on the state information, the operating state of the drive units driving the lamp panel to emit light.

Optionally, for the display device corresponding to FIG. 4, the control unit 920 is configured to output, during the display stage, a first drive current to the light-emitting devices of each of the light-emitting units through at least two of the plurality of drive units, to drive the lamp panel to display a target screen; and stop, in response to a faulty light-emitting unit existing in a first light-emitting unit set, outputting a drive current to light-emitting devices of a light-emitting-unit in a first subset in the first light-emitting unit set through the at least two of the plurality of drive units, and output a second drive current to light-emitting devices of a light-emitting unit in a second subset to drive the lamp panel to display the target screen, the second drive current being greater than the first drive current. The first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

Optionally, the control unit 920 is further configured to output, in response to the faulty light-emitting unit existing in the first light-emitting unit set, a third drive current to light-emitting devices of a light-emitting unit adjacent to the first light-emitting unit set in a second light-emitting unit set through the at least two of the plurality of drive units, the third drive current being different from the first drive current. The second light-emitting unit set is adjacent to the first light-emitting unit set, and a brightness difference between brightness values of each color corresponding to the first light-emitting unit set and the second light-emitting unit set satisfies a defined condition, the defined condition comprising the brightness difference being less than a difference threshold, or a ratio of the brightness difference to a brightness value of corresponding color in the second light-emitting unit set being less than a ratio threshold.

Optionally, the control module 920 is further configured to output a third drive current that is greater than the first drive current to light-emitting devices of a first target light-emitting unit in the second light-emitting unit set, wherein the first target light-emitting unit is adjacent to the light-emitting unit in the first subset; and/or, output a third drive current that is less than the first drive current to light-emitting devices of a second target light-emitting unit in the second light-emitting unit set, wherein the second target light-emitting unit is adjacent to the light-emitting unit in the second subset.

Optionally, the control module 920 is further configured to output, in response to the faulty light-emitting unit existing in the first light-emitting unit set, a fourth drive current to light-emitting devices of a third target light-emitting unit in the second light-emitting unit set through the at least two of the plurality of drive units, wherein an absolute value of a difference between the fourth drive current and the first drive current is equal to an absolute value of a difference between the third drive current and the first drive current, and a symbol of the difference between the fourth drive current and the first drive current and a symbol of the difference between the third drive current and the first drive current are opposite. The third target light-emitting unit is not adjacent to the first light-emitting unit set, and the third target light-emitting unit and the light-emitting unit adjacent to the first light-emitting unit set belong to different subsets.

Optionally, the control module 920 is further configured to drive, during a fault detection stage by one of the plurality of drive units, a light-emitting device, corresponding to a first color, in the plurality of light-emitting units to emit light; and drive, during the fault detection stage by another one of the plurality of drive units, a light-emitting device, corresponding to a second color, in the plurality of light-emitting units to emit light, wherein the first color is different from the second color.

Optionally, the control module 920 is further configured to drive, during a first period of the fault detection stage by one of the plurality of drive units, a light-emitting device, corresponding to a third color, in the plurality of light-emitting units to emit light; and stop driving, during a second period of the fault detection stage, the light-emitting device, corresponding to the third color, in the plurality of light-emitting units to emit light, and drive, by another one of the plurality of light-emitting unit, a light-emitting device, corresponding to a fourth color, in the plurality of light-emitting units to emit light.

It should be noted that: when the display drive device according to the above embodiments performs the display drive, a description is only given to the above division of the functional modules. The above functions of the apparatus may be distributed to different functional modules according to actual needs. That is, an internal structure of the apparatus is divided into different functional modules to implement a part or all of the functions as described above. In addition, the display drive device according to the above embodiments is based on the same concept as the display drive method embodiments as described above, and the specific implementation process of the display drive device is detailed in the method embodiments, which is not repeated herein.

Figure 13:
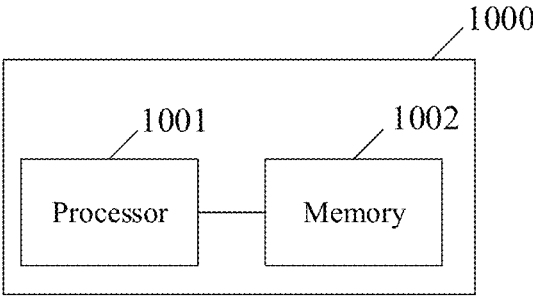
FIG. 13 is a structural schematic diagram of another display drive device according to some embodiments of the present disclosure.

FIG. 13 is a structural block diagram of a display drive device according to some embodiments of the present disclosure. As shown in FIG. 13, the display drive device is a computer device, such as part or all of the aforementioned control unit. The display drive device 1000 includes a processor 1001 and a memory 1002.

The processor 1001 includes one or more processing cores, such as a five-core processor, an eight-core processor, and the like. The processor 1001 is implemented using at least one hardware form of a digital signal processor (DSP), a field-programmable gate array (FPGA), or a programmable logic array (PLA). The processor 1001 further includes a main processor and a co-processor. The main processor is a processor employed to process data in an awakening state, also referred to as a central processing unit (CPU); and the co-processor is a low-power processor employed to process data in a standby state.

The memory 1002 includes one or more computer-readable storage media. The one or more computer-readable storage media are non-transitory. The memory 1002 further includes a high-speed random access memory and a non-transitory memory, such as one or more disk storage devices and a flash memory storage device. In some embodiments, the non-transitory computer-readable storage medium in the memory 1002 is employed to store one or more instructions, wherein the one or more instructions, when loaded and executed by processor 1001, causes the processor 101 to perform the display drive method according to some embodiments of the present disclosure.

It should be understood by those skilled in the art that the structure illustrated in FIG. 13 does not constitute a limitation to the computer device 1000. The computer device 1000 includes more or fewer components than illustrated in FIG. 10, or a combination of certain components, or are arranged with different components.

Some embodiments of the present disclosure further provide a non-transitory computer-readable storage medium storing one or more instructions therein. The one or more instructions stored in the non-transitory computer-readable storage medium, when loaded and executed by a processor of a computer device, cause the computer device to perform the display drive method according to some embodiments of the present disclosure.

Some embodiments of the present disclosure further provide a computer program product storing one or more programs/instructions therein, wherein the one or more programs/instructions, when loaded and executed by a processor, cause the processor to perform the display drive method according to some embodiments of the present disclosure.

It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity, or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "connect," "contact," and the like are not intended to be limited to physical or mechanical connections, but may include electrical connections, either direct or indirect connection. The terms "on," "under," "left," "right" "top," and "bottom" are only used to indicate the relative positional relationship. When the absolute position of the described object changes, the relative positional relationship may change accordingly.

The described above are not intended to construe any limitation to the present disclosure in any form. Although the present disclosure has been disclosed with reference to the embodiments, described above is not intended to limit the present disclosure. Changes or modifications may be made, within the scope of the technical solutions of the present disclosure, by those skilled in the art to be the equivalent embodiments of equivalent changes by using the technical content disclosed above. However, any simple modifications and equivalent changes and modifications made based on the technical substance of the present disclosure shall be included in the scope of the technical solutions of the present disclosure.

The invention claimed is:

1. A display drive system, comprising: a plurality of drive units, a control unit, and a power supply unit; wherein
the plurality of drive units are connected to a lamp panel, and at least one of the plurality of drive units is configured to drive, during a display stage, the lamp panel to emit light; and the control unit is connected to the plurality of drive units, and is configured to detect an operating state of the drive units driving the lamp panel to emit light;
wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit; and
the power supply unit is connected to the plurality of drive units;
wherein a plurality of drive integrated circuits (ICs) in each of the drive units are organized into a plurality of drive IC groups, each of the drive IC groups comprising a plurality of drive ICs arranged along a first direction, and the drive IC groups of the plurality of drive units being alternatively arranged in a second direction.

2. The display drive system according to claim 1, wherein the power supply unit comprises a power supply selector and a plurality of power supply sub-units, wherein the power supply selector is connected to the plurality of power supply sub-units and the plurality of drive units; and
the power supply selector is configured to receive voltages provided by the plurality of power supply sub-units, and to output a higher voltage among the voltages provided by the plurality of power supply sub-units to the plurality of drive units.

3. The display drive system according to claim 2, wherein the power supply selector comprises a plurality of diodes; wherein
an anode of each of the diodes is connected to an output terminal of one of the plurality of power supply sub-units, the power supply sub-units connected to different diodes are different, cathodes of the plurality of diodes are connected and respectively connected to the plurality of drive units.

4. The display drive system according to claim 1, wherein the drive units driving the lamp panel to emit light comprise at least two of the plurality of drive units; and
the lamp panel comprises a plurality of light-emitting units arranged in arrays, each of the light-emitting units comprising a plurality of light-emitting devices for emitting light of different colors, and the plurality of light-emitting units comprise a plurality of light-emitting unit sets arranged in an array, wherein each of the light-emitting unit sets comprises at least two subsets, each of the subsets comprising at least one light-emitting unit, and light-emitting units in different subsets being connected to different drive units in the at least two drive units.

5. The display drive system according to claim 4, wherein the light-emitting units in the at least two subsets are alternately arranged in the first direction and/or the second direction.

6. The display drive system according to claim 5, wherein each of the light-emitting unit sets comprises two of the subsets, each of the subsets comprising two light-emitting units.

7. The display drive system according to claim 5, wherein the at least two drive units are configured to output, during the display stage, a first drive current to the light-emitting devices of each of the light-emitting units to drive the lamp panel to display a target screen; and
the at least two drive units are further configured to stop, in response to a faulty light-emitting unit existing in a first light-emitting unit set, output a drive current to light-emitting devices of a light-emitting-unit in a first subset in the first light-emitting unit set, and output a second drive current to light-emitting devices of a light-emitting unit in a second subset to drive the lamp panel to display the target screen, the second drive current being greater than the first drive current;

wherein the first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

8. The display drive system according to claim 7, wherein the at least two drive units are further configured to output, in response to the faulty light-emitting unit existing in the first light-emitting unit set, a third drive current to light-emitting devices of a light-emitting unit adjacent to the first light-emitting unit set in a second light-emitting unit set, the third drive current being different from the first drive current;

wherein the second light-emitting unit set is adjacent to the first light-emitting unit set, and a brightness difference between brightness values of each color corresponding to the first light-emitting unit set and the second light-emitting unit set satisfies a defined condition, the defined condition comprising the brightness difference being less than a difference threshold, or a ratio of the brightness difference to a brightness value of corresponding color in the second light-emitting unit set being less than a ratio threshold.

9. The display drive system according to claim 8, wherein the at least two drive units are further configured to output, in response to the faulty light-emitting unit existing in the first light-emitting unit set, a third drive current that is greater than the first drive current to light-emitting devices of a first target light-emitting unit in the second light-emitting unit set, wherein the first target light-emitting unit is adjacent to the light-emitting unit in the first subset; and/or, the at least two drive units are further configured to output, in response to the faulty light-emitting unit existing in the first light-emitting unit set, a third drive current that is less than the first drive current to light-emitting devices of a second target light-emitting unit in the second light-emitting unit set, wherein the second target light-emitting unit is adjacent to the light-emitting unit in the second subset.

10. The display drive system according to claim 9, wherein an absolute value of a difference between the third drive current and the first drive current is positively correlated with the first drive current and negatively correlated with the ratio.

11. The display drive system according to claim 9, wherein at least two drive units are further configured to output, in response to the faulty light-emitting unit existing in the first light-emitting unit set, a fourth drive current to light-emitting devices of a third target light-emitting unit in the second light-emitting unit set, wherein an absolute value of a difference between the fourth drive current and the first drive current is equal to an absolute value of a difference between the third drive current and the first drive current, and a symbol of the difference between the fourth drive current and the first drive current and a symbol of the difference between the third drive current and the first drive current are opposite;

wherein the third target light-emitting unit is not adjacent to the first light-emitting unit set, and the third target light-emitting unit and the light-emitting unit adjacent to the first light-emitting unit set belong to different subsets.

12. The display drive system according to claim 7, wherein each of the drive ICs is connected to the plurality of light-emitting units through a plurality of drive lines, and the control unit is connected to the plurality of drive lines;

wherein the control unit is configured to detect state information of a signal in each of the drive lines, and determine, based on the state information, whether a fault exists in a light-emitting unit connected to the drive line.

13. A display drive method, comprising:

during a display stage, driving, by at least two of a plurality of drive units, a lamp panel to emit light, wherein the plurality of drive units are connected to the lamp panel;

detecting an operating state of the drive units driving the lamp panel to emit light; and in response to the operating state of a first drive unit being abnormal, driving, by a second drive unit, the lamp panel to emit light, wherein the first drive unit is at least one of the drive units driving the lamp panel to emit light, and the second drive unit is at least one of the plurality of drive units other than the first drive unit;

wherein a plurality of drive integrated circuits (ICs) in each of the drive units are organized into a plurality of drive IC groups, each of the drive IC groups comprising a plurality of drive ICs arranged along a first direction, and the drive IC groups of the plurality of drive units being alternatively arranged in a second direction.

14. The display drive method according to claim 13, wherein the lamp panel comprises a plurality of light-emitting units arranged in arrays, each of the light-emitting units comprising a plurality of light-emitting devices for emitting light of different colors, and the plurality of light-emitting units comprise a plurality of light-emitting unit sets arranged in an array, wherein each of the light-emitting unit sets comprises at least two subsets, each of the subsets comprising at least one light-emitting unit, and light-emitting units in different subsets being connected to different drive units in the at least two drive units;

during the display stage, driving, by the at least two of the plurality of drive units, the lamp panel to emit light comprises:

outputting, during the display stage, a first drive current to the light-emitting devices of each of the light-emitting units to drive the lamp panel to display a target screen; and stopping, in response to a faulty light-emitting unit existing in a first light-emitting unit set, outputting a drive current to light-emitting devices of a light-emitting-unit in a first subset in the first light-emitting unit set, and outputting a second drive current to light-emitting devices of a light-emitting unit in a second subset to drive the lamp panel to display the target screen, the second drive current being greater than the first drive current;

wherein the first light-emitting unit set is any one of the plurality of light-emitting unit sets, and each of the light-emitting unit sets corresponds to one pixel in the target screen, the first subset is a subset to which the faulty light-emitting unit belongs, and the second subset is a subset other than the first subset in the first light-emitting unit set.

15. The display drive method according to claim 14, wherein during the display stage, driving, by the at least two of the plurality of drive units, the lamp panel to emit light further comprises:

outputting, in response to the faulty light-emitting unit existing in the first light-emitting unit set, a third drive current to light-emitting devices of a light-emitting unit adjacent to the first light-emitting unit set in a second light-emitting unit set, the third drive current being different from the first drive current;

wherein the second light-emitting unit set is adjacent to the first light-emitting unit set, and a brightness difference between brightness values of each color corresponding to the first light-emitting unit set and the second light-emitting unit set satisfies a defined condition, the defined condition comprising the brightness difference being less than a difference threshold, or a ratio of the brightness difference to a brightness value of corresponding color in the second light-emitting unit set being less than a ratio threshold.

16. The display drive method according to claim 15, wherein outputting the third drive current to the light-emitting devices of the light-emitting unit adjacent to the first light-emitting unit set in the second light-emitting unit set comprises:

outputting a third drive current that is greater than the first drive current to light-emitting devices of a first target light-emitting unit in the second light-emitting unit set, wherein the first target light-emitting unit is adjacent to the light-emitting unit in the first subset; and/or, outputting a third drive current that is less than the first drive current to light-emitting devices of a second target light-emitting unit in the second light-emitting unit set, wherein the second target light-emitting unit is adjacent to the light-emitting unit in the second subset.

17. A display drive device, comprising: a memory and a processor;

wherein the memory stores one or more computer programs, wherein the one or more computer programs, when loaded and run by the processor, cause the processor to perform the display drive method as defined in claim 13.

18. A non-transitory computer-readable storage medium, storing one or more instructions therein, wherein the one or more instructions, when loaded and executed by a processor, cause the processor to perform the display drive method as defined in claim 13.

19. A display device, comprising: a lamp panel and a display drive system;

wherein the display drive system is connected to the lamp panel; and the display drive system comprises a plurality of drive units, a control unit, and a power supply unit; wherein the plurality of drive units are connected to a lamp panel, and at least one of the plurality of drive units is configured to drive, during a display stage, the lamp panel to emit light; and the control unit is connected to the plurality of drive units, and is configured to detect an operating state of the drive units driving the lamp panel to emit light;

wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit; and the power supply unit is connected to the plurality of drive units;

wherein a plurality of drive integrated circuits (ICs) in each of the drive units are organized into a plurality of drive IC groups, each of the drive IC groups comprising a plurality of drive ICs arranged along a first direction, and the drive IC groups of the plurality of drive units being alternatively arranged in a second direction.

* * * * *